(12) United States Patent
Kato

(10) Patent No.: US 10,787,740 B2
(45) Date of Patent: Sep. 29, 2020

(54) FILM FORMATION TIME SETTING METHOD

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 16/223,638

(22) Filed: Dec. 18, 2018

(65) Prior Publication Data
US 2019/0203355 A1 Jul. 4, 2019

(30) Foreign Application Priority Data

Jan. 4, 2018 (JP) ................................ 2018-000204

(51) Int. Cl.
| | | |
|---|---|---|
| *C23C 16/455* | (2006.01) | |
| *H01J 37/32* | (2006.01) | |
| *C23C 16/40* | (2006.01) | |
| *C23C 16/34* | (2006.01) | |
| *C23C 16/46* | (2006.01) | |
| *C23C 16/458* | (2006.01) | |

(52) U.S. Cl.
CPC ...... *C23C 16/45544* (2013.01); *C23C 16/345* (2013.01); *C23C 16/401* (2013.01); *C23C 16/4584* (2013.01); *C23C 16/46* (2013.01); *H01J 37/32715* (2013.01); *H01J 2237/20214* (2013.01); *H01J 2237/24592* (2013.01); *H01J 2237/332* (2013.01)

(58) Field of Classification Search
CPC ................................................. H01J 37/32779
See application file for complete search history.

(56) References Cited

FOREIGN PATENT DOCUMENTS

JP 2017-152430 8/2017

*Primary Examiner* — Joel G Horning
(74) *Attorney, Agent, or Firm* — IPUSA, PLLC

(57) ABSTRACT

A film formation time setting method to be implemented when forming silicon-containing films on a plurality of substrates arranged on a rotary table includes a film thickness measuring step of performing a provisional film forming process for a provisional film formation time T×N, provisionally set up based on a cycle time T and a number of cycles N, measuring film thicknesses $d_{N-1}$ of the silicon-containing films formed on the substrates at an end time of the $(N-1)^{th}$ cycle, measuring film thicknesses $d_{N-1 \sim N}$ of the silicon-containing films at an intermediate time between the $(N-1)^{th}$ cycle and the $N^{th}$ cycle, and measuring film thicknesses $d_N$ of the silicon-containing films at an end time of the $N^{th}$ cycle; and a film formation time specifying step of comparing the inter-plane uniformities of the silicon-containing films at the respective times to specify and set a film formation time for achieving an optimal inter-plane uniformity.

7 Claims, 12 Drawing Sheets

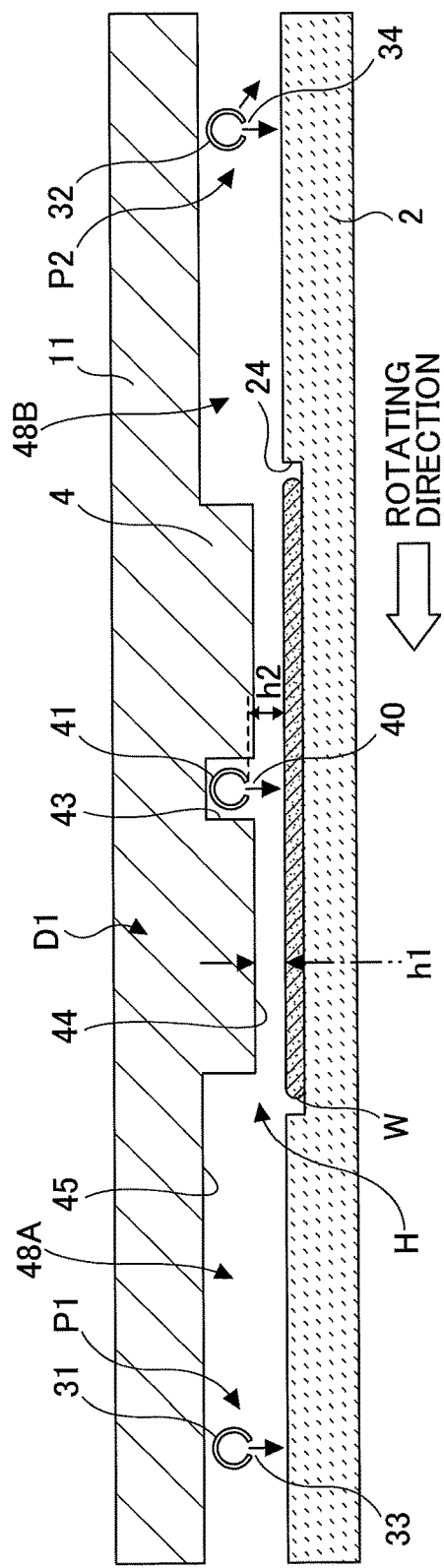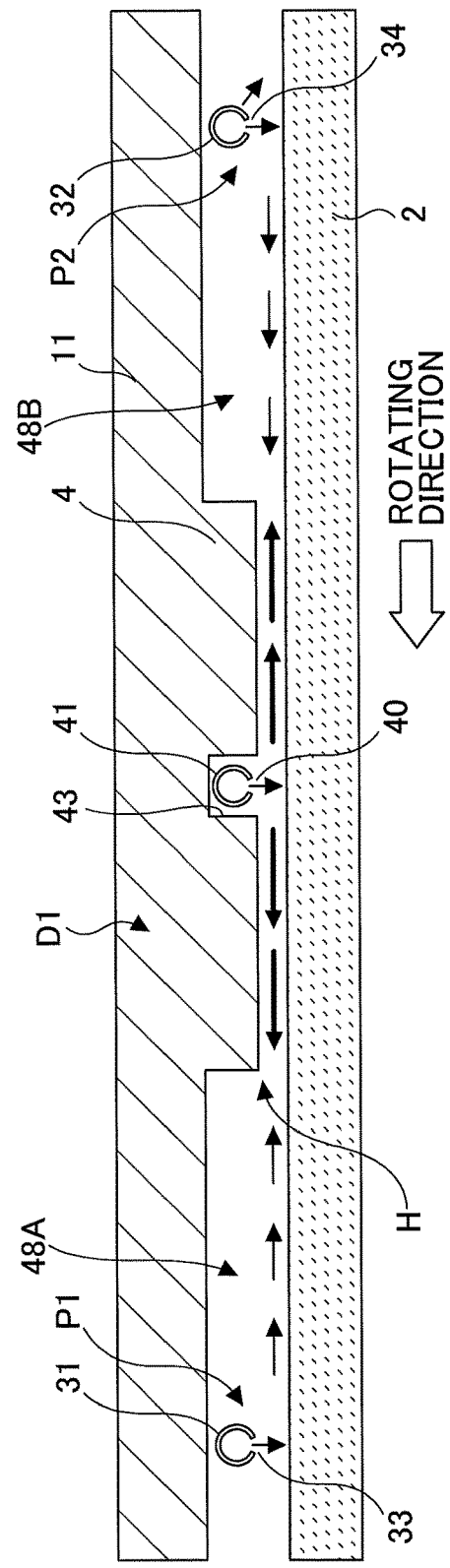

FILM FORMATION TIME SETTING METHOD

CROSS-REFERENCE TO RELATED APPLICATION

The present application is based on and claims priority to Japanese Patent Application No. 2018-000204 filed on Jan. 4, 2018, the entire contents of which are hereby incorporated by reference.

BACKGROUND OF THE INVENTION

1. Field of the Invention

The present invention relates to a film formation time setting method.

2. Description of the Related Art

A film forming apparatus is known that includes a processing chamber equipped with a flat vacuum chamber having a substantially circular planar shape and a rotary table provided inside the vacuum chamber that has a rotation center coinciding with the center of the vacuum chamber. The film forming apparatus also includes a control unit for controlling the overall operation of the film forming apparatus. A plurality of substrates are placed on the rotary table in the processing chamber, and a silicon-containing film such as a silicon oxide film or a silicon nitride film is formed on the substrates while rotating the rotary table (see, e.g., Japanese Unexamined Patent Publication No. 2017-152430).

The processing chamber equipped with the rotary table as described above has areas such as an adsorption area (raw material gas supply area), a gas separation area (separation area for separating a reaction gas such as raw material gas and an oxidizing gas from each other), a reaction area (reaction gas supply area), a gas separation area, and the like that are sequentially arranged in the rotation direction. By rotating the rotary table, a silicon-containing film may be formed on each of the substrates placed on the rotary table as the substrates sequentially pass through the above areas of the processing chamber, and as the cycle progresses, the silicon-containing film accumulates to reach a predetermined thickness (target film thickness). Normally, the cycle time per cycle is set and the film thickness of the silicon-containing film to be formed per cycle is specified such that the required number of cycles for reaching the target film thickness can be determined. By multiplying the cycle time per cycle by the required number of cycles, the required film formation time for forming the silicon-containing film having the target film thickness is set up.

Note that because each of the substrates placed on the rotary table is supplied with a raw material gas the same number of times, in principle, the film thicknesses of the silicon-containing films formed on all the substrates should be the same, and good uniformity (inter-plane uniformity) should be achieved with respect to the film thickness and the like of the silicon-containing films formed on the substrates. However, the inter-plane uniformity of the film thickness and the like of the silicon-containing films formed on the substrates may be influenced by various factors such as the positional relationship between the raw material gas nozzle and the substrates at the time rotation of the rotary table is started, gas discharge conditions at the time supply of the raw material gas is started, gas discharge termination conditions at the end of gas supply, and the like.

Even if improvements are made with respect to apparatus performance or apparatus control to address the above problems of undesired influences on inter-plane uniformity, such improvement measures cannot prevent the raw material gas that has been supplied to the raw material gas supply region from spreading toward a substrate on the upstream side in the rotation direction where the raw material gas should not be supplied or prevent the raw material gas remaining in a raw material gas nozzle from being supplied to a substrate even when the raw material gas supply is ended, for example. In view of the above-described shortcomings of the approach of improving apparatus performance or apparatus control, a different approach is desired to achieve good inter-plane uniformity with respect to the film thickness and the like of the silicon-containing films formed on the substrates.

SUMMARY OF THE INVENTION

An aspect of the present invention is directed to providing a film formation time setting method to be implemented when forming silicon-containing films on a plurality of substrates that are arranged on a rotary table accommodated in a processing chamber so that good inter-plane uniformity can be achieved with respect to the film thickness and the like of the silicon-containing films formed on the substrates.

According to one embodiment of the present invention, a film formation time setting method is provided for setting up a film formation time when forming silicon-containing films on a plurality of substrates by arranging the substrates along a circumferential direction on a rotary table accommodated in a processing chamber, rotating the rotary table, and performing a film forming process for a predetermined film formation time. The film formation time setting method includes a film thickness measuring step that includes performing a provisional film forming process for a provisional film formation time T×N, which is provisionally set up based on a cycle time T and a number of cycles N, measuring a film thickness $d_{N-1}$ of each of the silicon-containing films formed on the substrates at an end time of a $(N-1)^{th}$ cycle of the provisional film formation process, measuring a film thickness $d_{N-1 \sim N}$ of each of the silicon-containing films formed on the substrates at an intermediate time between the $(N-1)^{th}$ cycle and a $N^{th}$ cycle of the provisional film forming process, and further measuring a film thickness $d_N$ of each of the silicon-containing films formed on the substrates at an end time of the $N^{th}$ cycle of the provisional film forming process; and a film formation time specifying step that includes comparing an inter-plane uniformity of the silicon-containing films formed on the substrates at the end time of the $(N-1)^{th}$ cycle, an inter-plane uniformity of the silicon-containing films formed on the substrates at the intermediate time between the $(N-1)^{th}$ cycle and the $N^{th}$ cycle, an inter-plane uniformity of the silicon-containing films formed on the substrates at the end time of the $N^{th}$ cycle to specify a time at which an optimal inter-plane uniformity of the silicon-containing films is achieved, and setting up the specified time as the film formation time.

BRIEF DESCRIPTION OF THE DRAWINGS

FIGS. 4A and 4B are longitudinal cross-sectional views of a supply region and a separation region of the film formation apparatus of FIG. 1;

DESCRIPTION OF THE PREFERRED EMBODIMENTS

Figure 1:
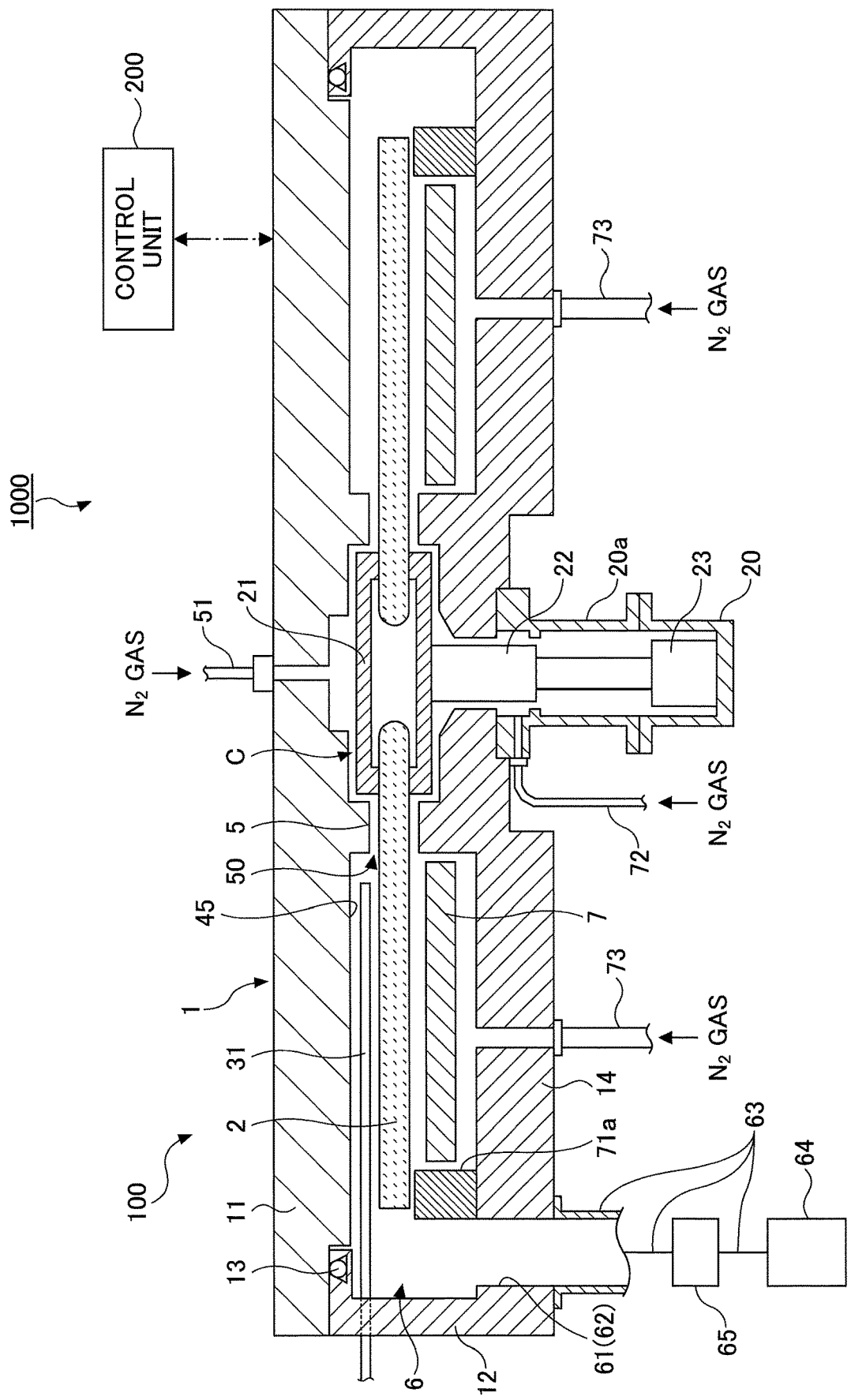
FIG. 1 is a longitudinal cross-sectional view of a film forming apparatus to be subjected to a film formation time setting method according to an embodiment of the present invention.

In the following, embodiments of a film formation time setting method according to the present invention will be described with reference to the accompanying drawings. First, a film forming apparatus to be subjected to a film formation time setting method according to an embodiment of the present invention will be described. Then, the film formation time setting method that is implemented in the film forming apparatus will be described. Note that in the following description and the drawings, elements having substantially the same features are given the same reference numerals and overlapping descriptions will be omitted.

[Film Forming Apparatus]

Figure 2:
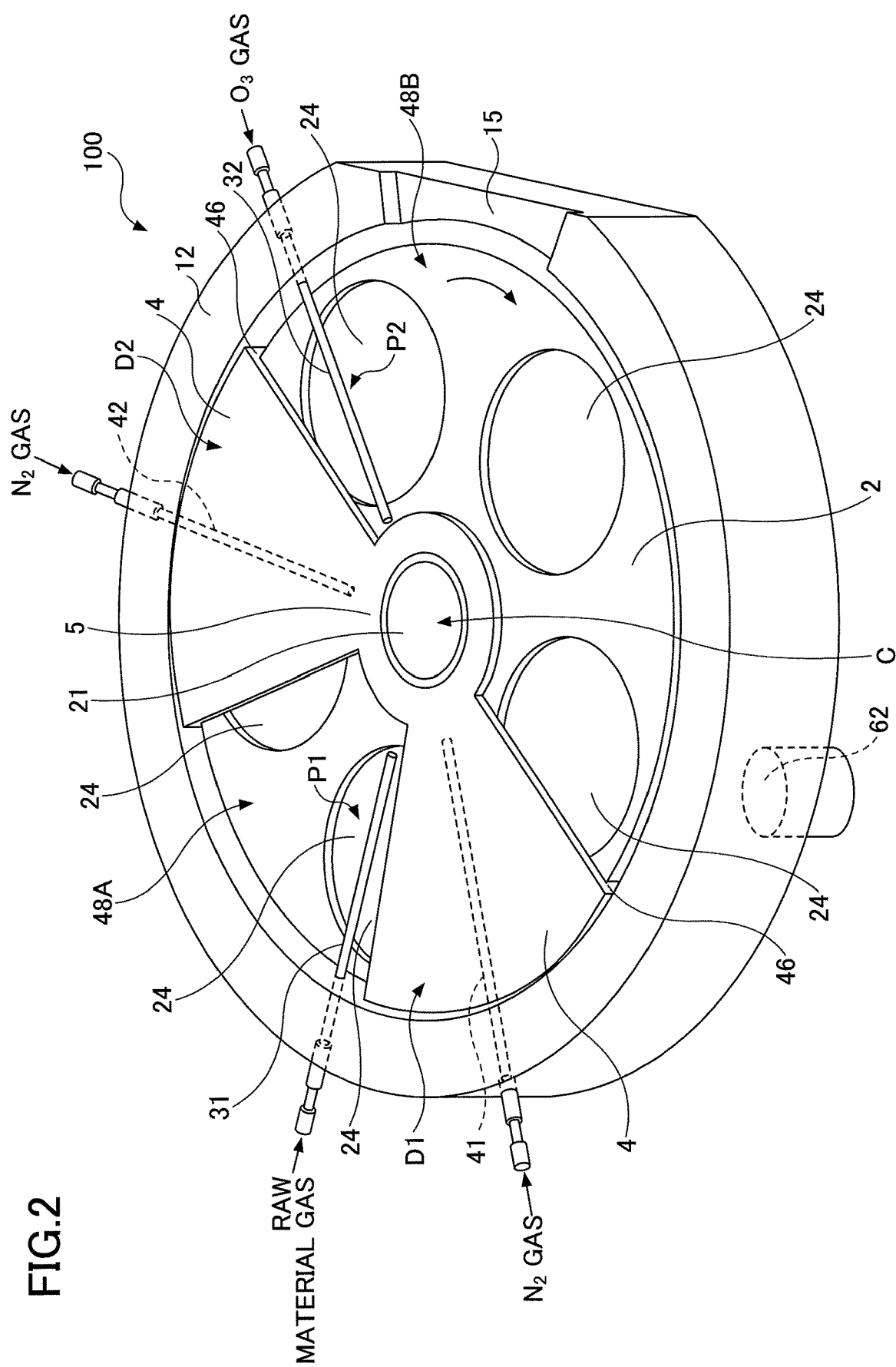
FIG. 2 is a schematic perspective view of an internal structure of the film forming apparatus of FIG. 1.
Figure 3:
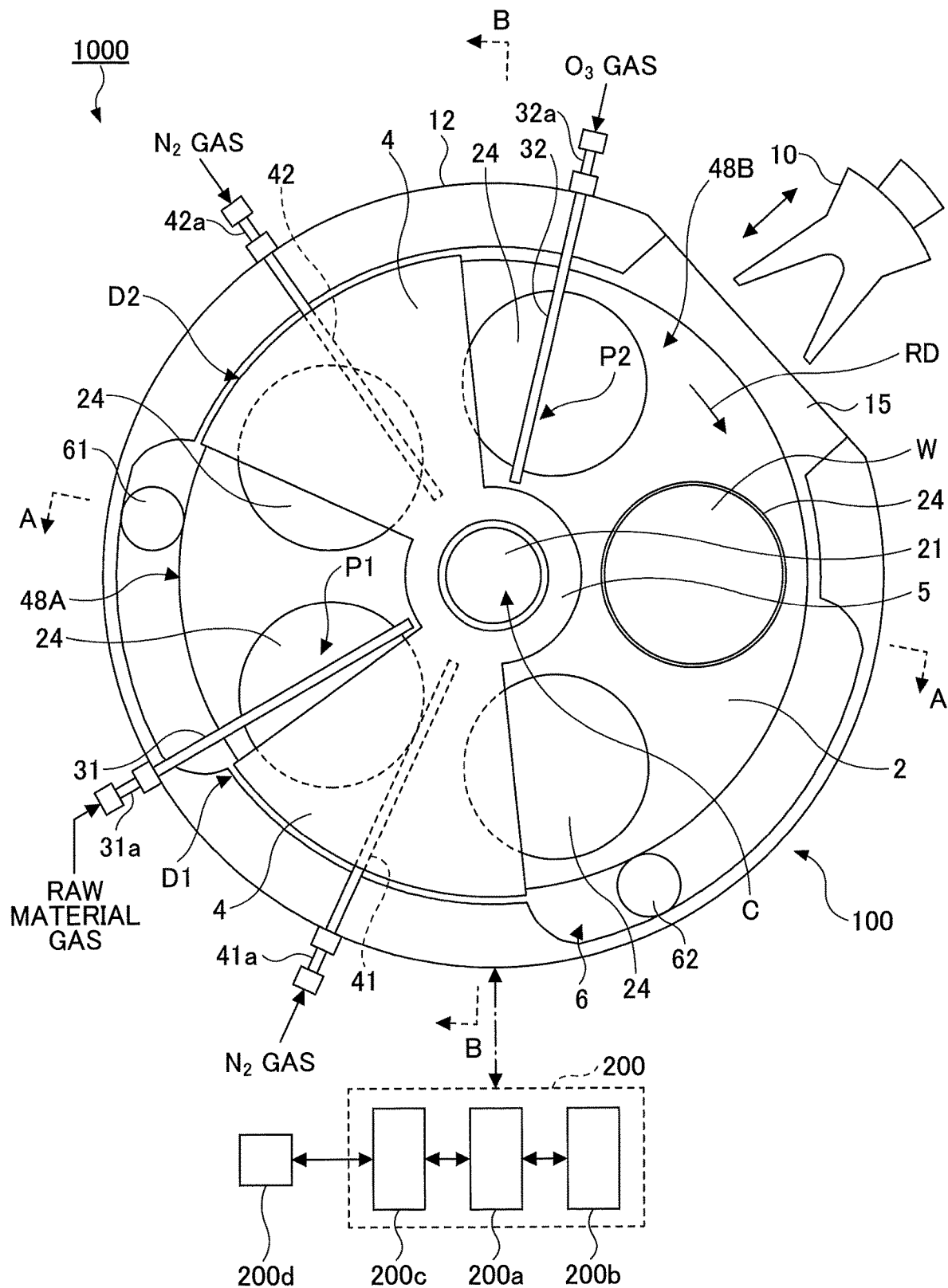
FIG. 3 is diagram showing a schematic plan view of the internal structure of the film formation apparatus along of FIG. 1 along with a schematic internal configuration of a control unit.
Figure 5A:
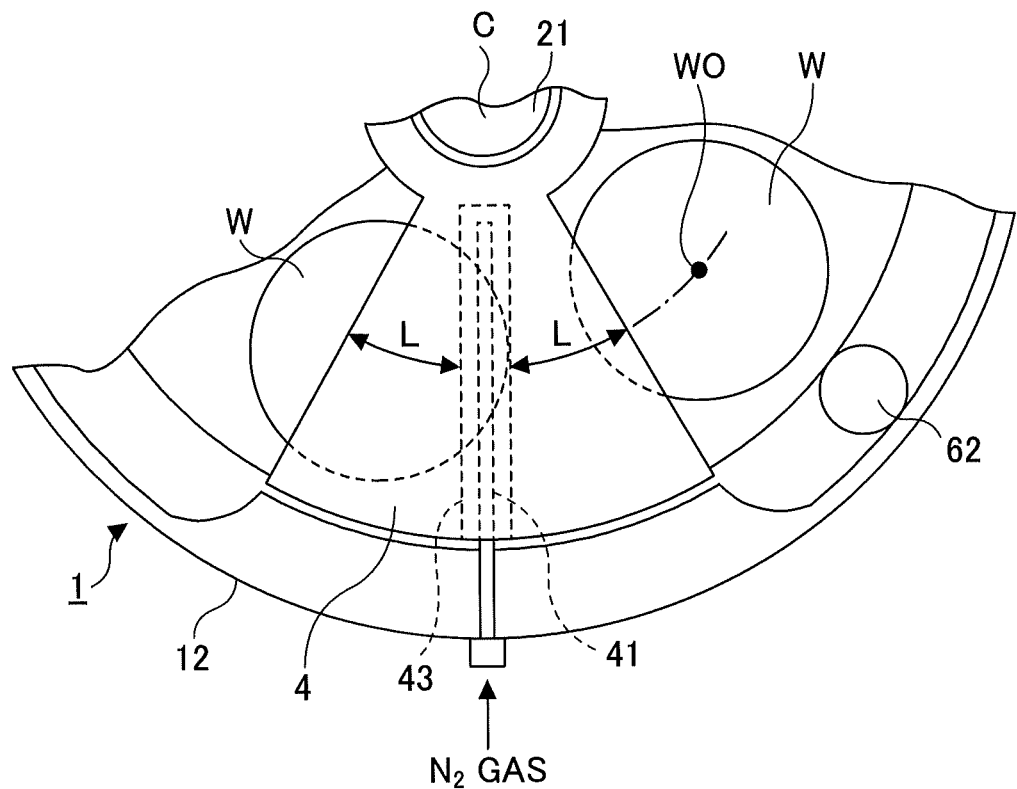
FIGS. 5A and 5B are diagrams illustrating the size of the separation region.
Figure 5B:
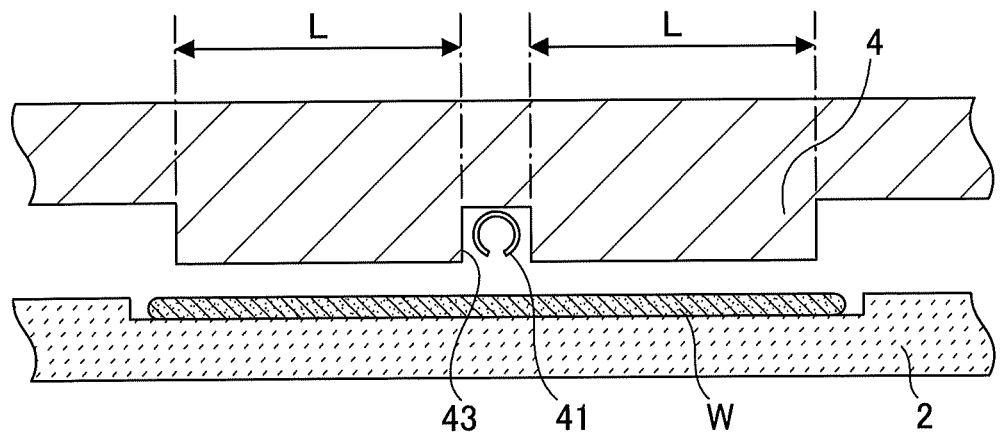
Figure 6:
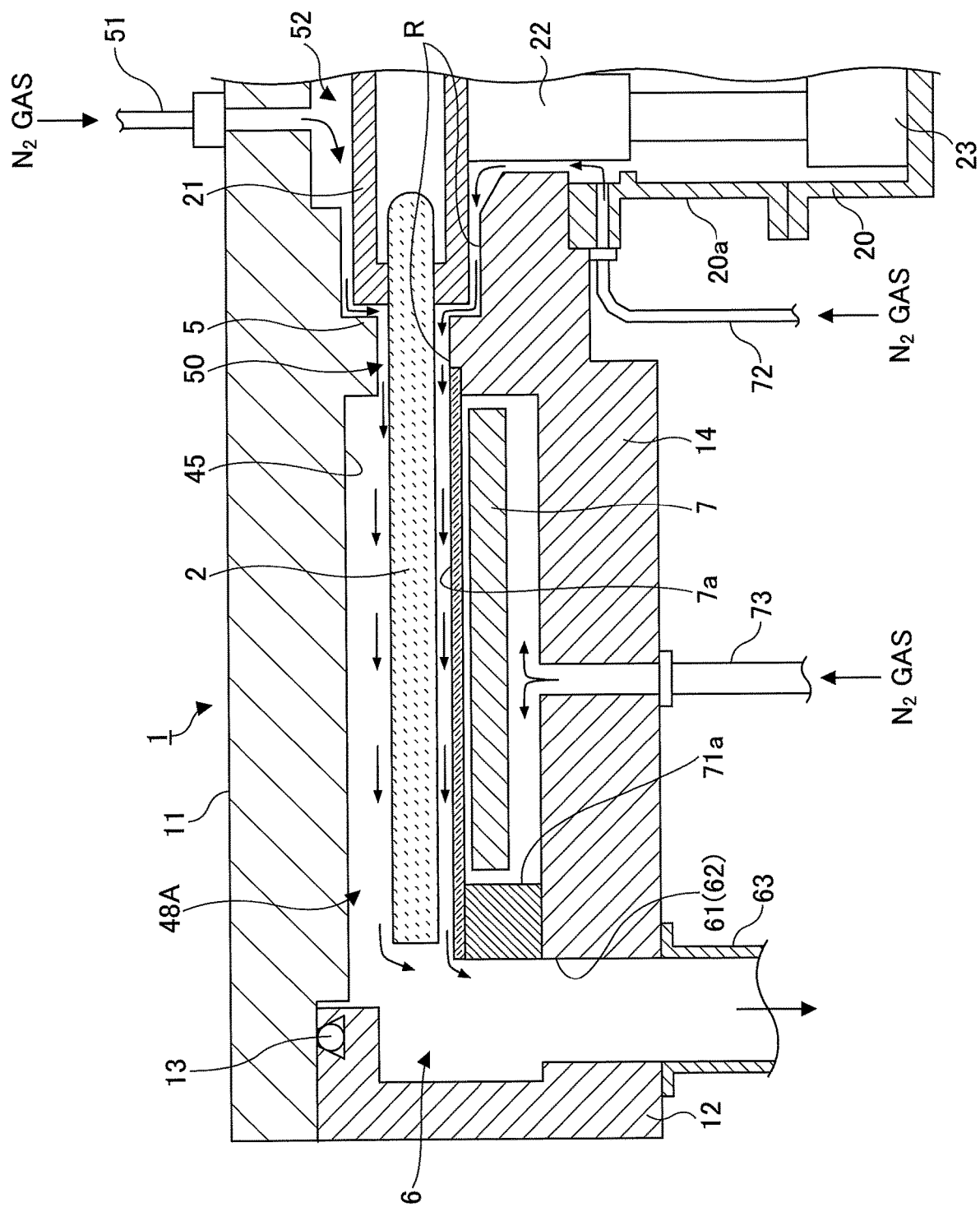
FIG. 6 is another longitudinal cross-sectional view of the film forming apparatus of FIG. 1.
Figure 7:
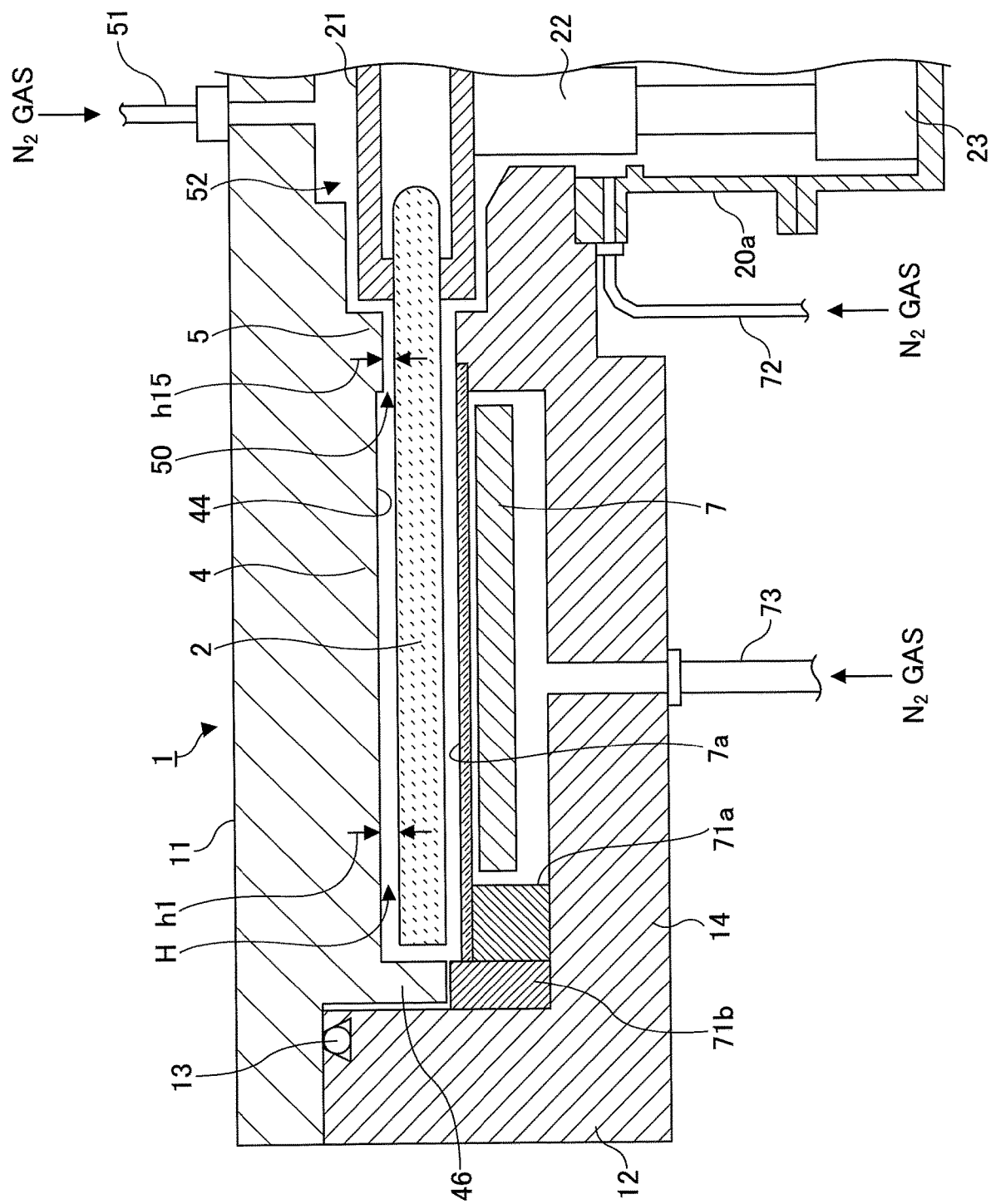
FIG. 7 is another longitudinal cross-sectional view of the film forming apparatus of FIG. 1.
Figure 8:
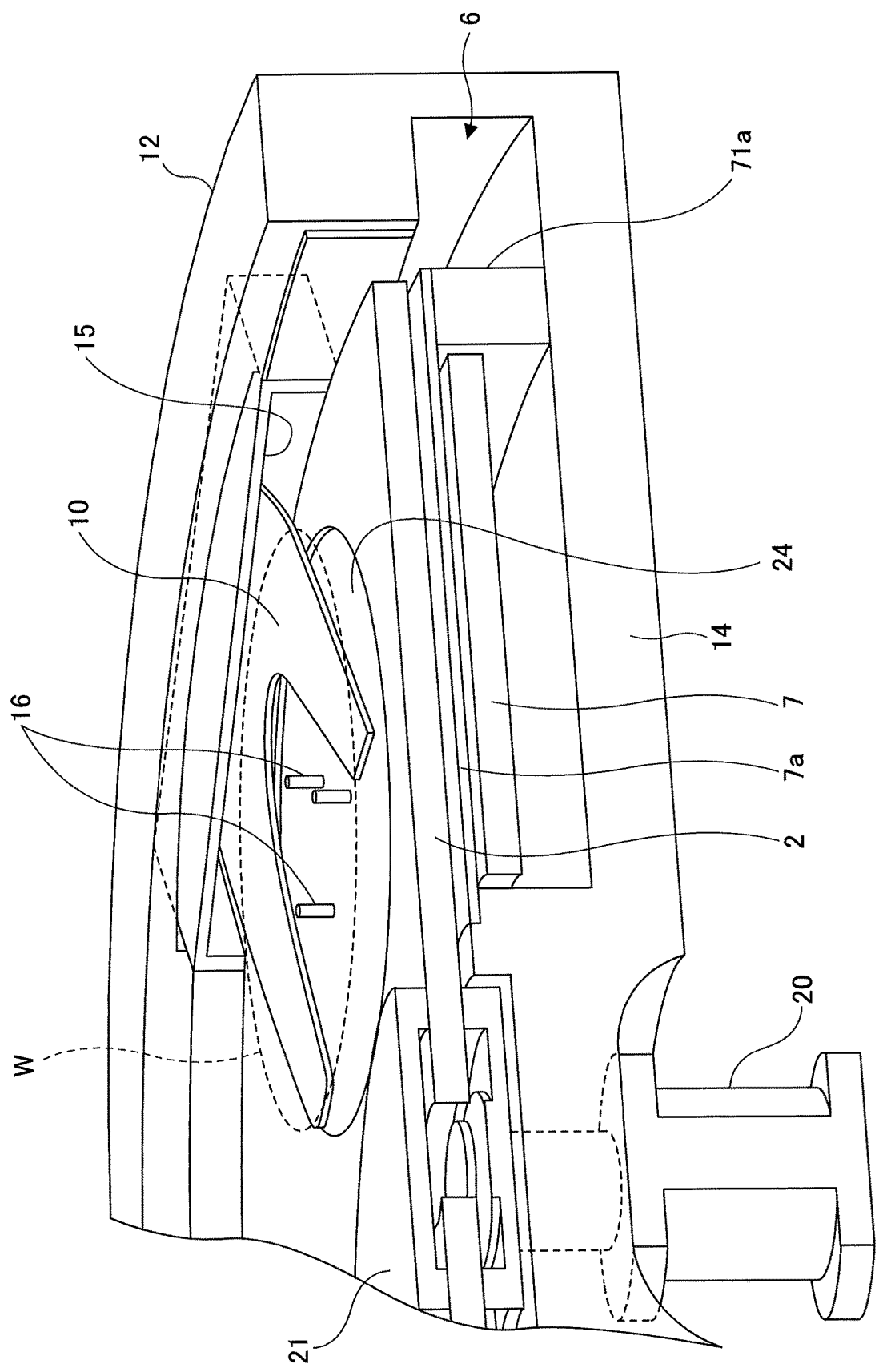
FIG. 8 is a partial perspective view of the film forming apparatus of FIG. 1.

First, a film forming apparatus to be subjected to a film formation time setting method according to an embodiment of the present invention will be described. Although the film formation time setting method according to an embodiment of the present invention can be implemented in various film forming apparatuses, a film forming apparatus according to one embodiment that is suitable for implementing a film formation time setting method according to an embodiment of the present invention will be described below. FIG. 1 is a longitudinal cross-sectional view of a film forming apparatus to be subjected to a film formation time setting method according to an embodiment of the present invention. FIG. 2 is a schematic perspective view of an internal structure of the film forming apparatus of FIG. 1. FIG. 3 is a diagram showing a schematic plan view of the internal structure of the film forming apparatus of FIG. 1 along with a schematic internal configuration of a control unit. FIGS. 4A and 4B are longitudinal cross-sectional views of a supply region and a separation region in the film forming apparatus of FIG. 1. FIGS. 5A and 5B are diagrams illustrating the size of the separation region. FIGS. 6 and 7 are other longitudinal cross-sectional views of the film forming apparatus. FIG. 8 is a partial perspective view of the film forming apparatus of FIG. 1.

As shown in FIG. 1 (cross-sectional view across line A-A of FIG. 3) and FIG. 2, the film forming apparatus 1000 to be subjected to a film formation time setting method according to an embodiment of the present invention includes a processing chamber 100 and a control unit 200. The processing chamber 100 includes a flat vacuum chamber 1 having a substantially circular plane shape and a rotary table 2 having a rotation center coinciding with the center of the vacuum chamber 1. The control unit 200 controls the overall operation of the film forming apparatus 1000. The vacuum chamber 1 is a processing chamber for accommodating a wafer W, as an example of a substrate, and performing a film forming process on the surface of the wafer W. The vacuum chamber 1 is composed of a chamber body 12 and a top plate 11 that can be detached from the chamber body 12. The top plate 11 is attached to the chamber body 12 via a sealing member 13 such as an O-ring, for example, and in this way, the vacuum chamber 1 is hermetically sealed in an airtight manner. The top plate 11 and the chamber body 12 may be made of aluminum (Al), for example. Further, the rotary table 2 may be made of quartz, for example.

As shown in FIG. 1, the rotary table 2 is disk-shaped and has a circular opening at its center. The rotary table 2 is held between a cylindrical core portion 21 that is arranged above and below the rotary table 2 near its center opening. The core portion 21 is fixed to an upper end of a rotating shaft 22 extending in the vertical direction. The rotating shaft 22 passes through a bottom portion 14 of the chamber body 12 and has a lower end attached to a driving unit 23 for rotating the rotating shaft 22 around a vertical axis. With such a configuration, the rotary table 2 can rotate around its center axis as the rotation center. The rotating shaft 22 and the driving unit 23 are accommodated in a cylindrical case body 20 that has an opening at an upper surface. The case body 20 is air-tightly attached to the bottom surface of the bottom portion 14 of the vacuum chamber 1 via a flange portion 20a provided on the upper surface of the case body 20, and in this way, the internal atmosphere of the case body 20 is isolated from the external atmosphere.

As shown in FIGS. 2 and 3, a plurality of recessed portions 24 (five in the illustrated example) having circular shapes in planar view that can accommodate wafers W are formed at equiangular intervals on the upper surface of the rotary table 2. Note, however, that in FIG. 3, only one recessed portion 24 has a wafer W accommodated therein.

FIG. 4A is a longitudinal cross-sectional view of the rotary table 2 with the wafer W placed in the recessed portion 24. As shown in FIG. 4A, the recessed portion 24 has a diameter (e.g., 4 mm) that is slightly larger than the diameter of the wafer W. Further, the depth of the recessed portion 24 is substantially equal to the thickness of the wafer W. By arranging the depth of the recessed portion 24 to be substantially equal to the thickness of the wafer W, when the wafer W is placed in the recessed portion 24, the surface of the wafer W will be at substantially the same height as the height of surface regions of the rotary table 2 other than the recessed portions 24 of the rotary table 2. If the height difference between the wafer W and the surface regions of the rotary table 2 other than the recessed portions 24 of the rotary table 2 is relatively large, the height difference may cause turbulence in the gas flow and influence the film thickness uniformity of the wafer W. In order to reduce such an influence, the surface of the wafer W and the surface regions of the rotary table 2 other than the recessed portions 24 of the rotary table 2 are arranged to be substantially the same height. Note that the expression "substantially the same height" as used herein refers a height difference of about 5 mm or less, for example, but the height difference is preferably as close to zero as possible within the allowable range of machining accuracy.

Referring to FIGS. 2 to 4B, two protruding portions 4 that are separated from one another are provided along the rotation direction of the rotary table 2 (e.g., arrow RD in FIG. 3). Note that in FIGS. 2 and 3, illustration of the top plate 11 is omitted for the sake of illustrating the interior of the vacuum chamber 1. As shown in FIGS. 4A and 4B, the protruding portion 4 is provided on the lower surface of the top plate 11. As can be appreciated from FIG. 3, the protruding portion 4 has a substantially fan-shaped planar shape with an apex portion of the substantially fan shape being positioned substantially at the center of the vacuum chamber 1 and a circular arc portion of the substantially fan shape being positioned along the inner peripheral wall of the chamber body 12. Further, as shown in FIG. 4A, a lower surface 44 (also referred to as "ceiling surface 44") of the protruding portion 4 is arranged to be at height h1 from the surface of the rotary table 2 or the surface of the wafer W placed in the recessed portion 24 of the rotary table 2.

As shown in FIGS. 3 to 4B, each protruding portion 4 has a groove portion 43 extending in the radial direction to divide the protruding portion 4 into two parts, and the groove portion 43 accommodates a separation gas nozzle 41 (42). Note that although the groove portion 43 is arranged to divide the protruding portion 4 into two equal parts in the present embodiment, the groove portion 43 may also be arranged to divide the protruding portion 4 so that the upstream side of the protruding portion 4 in the rotating direction of the rotary table 2 is larger than the downstream side, for example. As shown in FIG. 3, the separation gas nozzle 41 (42) is introduced into the vacuum chamber 1 from a peripheral wall portion of the chamber body 12, and a gas introduction port 41a (42a) corresponding to a base end portion of the separation gas nozzle 41 (42) is arranged at an outer peripheral wall of the chamber body 12 to support the separation gas nozzle (42).

The separation gas nozzle 41 (42) is connected to a separation gas supply source (not shown). Example gases that may be used as the separation gas include, nitrogen ($N_2$) gas, an inert gas, and the like, but the type of gas used is not particularly limited as long as it does not affect the film formation. In the present embodiment, $N_2$ gas is used as the separation gas. The separation gas nozzle 41 (42) also has discharge holes 40 (FIGS.

4A and 4B) for discharging $N_2$ gas toward the surface of the rotary table 2. The discharge holes 40 are arranged at predetermined intervals along the length direction of the separation gas nozzle 41 (42). In the present embodiment, the discharge holes 40 have a diameter of about 0.5 mm and are arranged at intervals of about 10 mm along the length direction of the separation gas nozzle 41 (42).

With the above configuration, the separation gas nozzle 41 and the corresponding protruding portion 4 provide a separation region D1 that defines a separation space H (FIGS. 4A and 4B). Similarly, the separation gas nozzle 42 and the corresponding protruding portion 4 provide a separation region D2 that defines a separation space H. Also, a first region 48A (first supply region) is formed downstream of the separation region D1 in the rotating direction of the rotary table 2. The first region 48A is substantially surrounded by the peripheral edges of the separation regions D1 and D2, the surface of the rotary table 2, a lower surface 45 of the top plate 11 (hereinafter referred to as "ceiling surface 45"), and the inner peripheral wall of the chamber body 12. Further, a second region 48B (second supply region) is formed upstream of the separation region D1 in the rotating direction of the rotary table 2. The second region 48B is substantially surrounded by the peripheral edges of the separation regions D1 and D2, the surface of the rotary table 2, the ceiling surface 45, and the inner peripheral wall of the chamber body 12. When $N_2$ gas is discharged from the separation gas nozzles 41 and 42 into the separation regions D1 and D2, the pressures at the separation spaces H of the separation regions D1 and D2 become relatively high such that the $N_2$ gas flows from the separation spaces H toward the first region 48A and the second region 48B. That is, the protruding portions 4 in the separation regions D1 and D2 guide the $N_2$ gas supplied from the separation gas nozzles 41 and 42 toward the first region 48A and the second region 48B.

Also, as shown in FIGS. 2 and 3, a raw material gas nozzle 31 is introduced into the first region 48A from the peripheral wall of the chamber body 12 to extend in the radial direction of the rotary table 2, and a reaction gas nozzle 32 for supplying an oxidizing gas such as ozone gas is introduced into the second region 48B from the peripheral wall of the chamber body 12 to extend in the radial direction of the rotary table 2. Like the separation gas nozzles 41 and 42, the raw material gas nozzle 31 and the reaction gas nozzle 32 are respectively supported by gas introduction ports 31a and 32a corresponding to base end portions of the raw material gas nozzle 31 and the reaction gas nozzle 32 arranged at the outer peripheral wall of the chamber body 12. Note that the oxidizing gas is not limited to ozone, and for example, oxygen may also be used as the oxidizing gas. In the present embodiment, a silicon oxide film ($SiO_2$ film) is formed as a silicon-containing film on the surface of the wafer W. However, in other embodiments, a silicon nitride film (SiN film) may be formed as the silicon-containing film, for example. In such case, a nitrogen-containing gas such as $NH_3$ may be supplied from the reaction gas nozzle 32, for example.

The raw material gas nozzle 31 and the reaction gas nozzle 32 respectively have a plurality of discharge holes 33 and 34 for discharging corresponding gases toward the upper surface of the rotary table 2 (the surface having the recessed portions 24 for accommodating the wafers W) (FIGS. 4A and 4B). In the present embodiment, the discharge holes 33 and 34 have a diameter of about 0.5 mm and are arranged at intervals of about 10 mm along the length direction of the raw material gas nozzle 31 and the reaction gas nozzle 32.

The raw material gas nozzle 31 is connected to a raw material gas supply source (not shown), and the reaction gas nozzle 32 is connected to an ozone gas supply source (not shown). Although various gases may be used as the raw material gas, in the present embodiment, a silicon-containing gas is used as the raw material gas. Specific examples of silicon-containing gases that may be used as the raw material gas include aminosilane gases such as DIPAS (diisopropylaminosilane) gas, 3DMAS (trisdimethylaminosilane) gas, BTBAS (bistarbutylaminosilane) gas, and the like. In the following, an example case where DIPAS gas is used as the raw material gas will be described. Note, also, that in the following description, a region below the raw material gas nozzle 31 where the DIPAS gas is to be adsorbed by the wafer W is referred to as "processing region P1", and a region below the reaction gas nozzle 32 where $O_3$ gas is to react with (oxidize) the DIPAS gas adsorbed to the wafer W is referred to as "processing region P2".

Also, a plasma processing region may be provided between the reaction gas nozzle 32 and the separation gas nozzle 41 above the rotary table 2, for example. An inductively coupled plasma (ICP) generator may be provided in the plasma processing region, and such a plasma generator may be connected to a radio frequency power source that can generate a radio frequency power having a frequency of 13.56 MHz, for example. A gas introduction port (not shown) may be arranged at the outer peripheral wall of the chamber body 12, and a reaction gas nozzle (not shown) supported by the gas introduction port may be introduced into the plasma processing region to extend in the radial direction of the rotary table 2 in a manner similar to the material gas nozzle 31, for example. The above-described reaction gas nozzle may be connected to an argon (Ar) gas supply source (not shown) that is filled with argon (Ar) gas, an oxygen ($O_2$) gas supply source (not shown) that is filled with oxygen ($O_2$) gas, and a hydrogen ($H_2$) gas supply source (not shown) that is filled with hydrogen ($H_2$) gas. Ar gas, $O_2$ gas, and $H_2$ gas that are respectively controlled by corresponding flow controllers to be supplied at a predetermined flow rate ratio (mix ratio) may be supplied from the argon gas supply source, the oxygen gas supply source, and the hydrogen gas supply source into the plasma processing region. The reaction gas nozzle may have a plurality of discharge holes formed at predetermined intervals along the longitudinal direction of the reaction gas nozzle so that the Ar/$O_2$/$H_2$ gas may be discharged from the discharge holes. When a radio frequency power is supplied to the plasma generator, an electromagnetic field may be generated, and an electric field component of the electromagnetic field may be propagated into the plasma processing region. The electric field component of the electromagnetic field may cause the generation of a plasma from the Ar/$O_2$/$H_2$ gas supplied to the plasma processing region via the reaction gas nozzle, and the plasma of the Ar/$O_2$/$H_2$ gas may be used to perform a uniform modification process on the silicon-containing films.

Referring back to FIG. 4A, the ceiling surface 44 at the separation region D1 is arranged to be a low ceiling surface (although not shown, a similarly low ceiling surface is provided at the separation region D2). On the other hand, ceiling surfaces 45 at the first region 48A and the second region 48B are higher than the ceiling surface 44. Therefore, the volumes of the first region 48A and the second region 48B are larger than the volumes of the separation spaces H in the separation regions D1 and D2. As will be described below, the vacuum chamber 1 according to the present embodiment is provided with exhaust ports 61 and 62 for exhausting the first region 48A and the second region 48B, respectively. By providing these exhaust ports 61 and 62, the pressures at the first region 48A and the second region 48B may be maintained at lower pressures as compared with the pressures at the separation spaces H of the separation regions D1 and D2. In this case, because the pressures at the separation spaces H of the separation regions D1 and D2 are higher, the DIPAS gas discharged from the raw material gas nozzle 31 in the first region 48A cannot pass through the separation space H and reach the second region 48B. Similarly, because the pressures at the separation spaces H of the separation regions D1 and D2 are higher, $O_3$ gas discharged from the reaction gas nozzle 32 in the second region 48B cannot pass through the separation space H and reach the first region 48A. In this way, the above two gases (i.e., the DIPAS gas and the $O_3$ gas) can be separated by the separation regions D1 and D2 such that the gases will hardly be mixed together in the gas phase inside the vacuum chamber 1.

Although the height h1 of the low ceiling surface 44 (FIG. 4A) measured from the upper surface of the rotary table 2 depends on the amount of $N_2$ gas supplied from the separation gas nozzle 41 (42), the height h1 is suitably adjusted so that the pressures at the separation spaces H of the separation regions D1 and D2 will be higher than the pressures at the first region 48A and the second region 48B. For example, the height h1 is preferably set to be in a range from 0.5 mm to 10 mm, and is more preferably set to be as low as possible. However, to avoid collision of the rotary table 2 against the ceiling surface 44 due to rotational blur of the rotary table 2, the height h1 is more preferably set to be in a range from about 3.5 mm to 6.5 mm within the above numerical range. Also, a height h2 (FIG. 4A) of the lower edge of the separation gas nozzle 42 (41) accommodated in the groove portion 43 of the protruding portion 4 from the surface of the rotary table 2 is preferably adjusted to be in a range from 0.5 mm to 4 mm for the same reasons.

Also, referring to FIGS. 5A and 5B, a length L of an arc corresponding to a path travelled by a wafer center W0 across half the protruding portion 4 is preferably set to be about 1/10 to about 1/1 of the diameter of the wafer W, and more preferably at least about 1/6 of the diameter of the wafer W. By setting the length L of the arc to be within the above numerical range, the pressures at the separation spaces H of the separation regions D1 and D2 can be reliably maintained at desirably high pressures.

By arranging the separation regions D1 and D2 to have the above-described configuration, the DIPAS gas and the $O_3$ gas can be more reliably separated even when the rotary table 2 rotates at a rotation speed about 20 rpm, for example.

Referring back to FIGS. 1 to 3, an annular protruding portion 5 surrounding the core portion 21 is provided on the ceiling surface 45 of the top plate 11. The protruding portion 5 faces a region of the rotary table 2 at the outer side of the core portion 21. In the present embodiment, as clearly shown in FIG. 7, a height h15 of a space 50 defined by the lower surface of the protruding portion 5 from the rotary table 2 is slightly lower than the height h1 of the space H. This is because the rotational blur around the center of the rotary table 2 is smaller than that at the periphery of the rotary table 2. Specifically, the height h15 may be set to be in a range from about 1.0 mm to 2.0 mm. Note that in other embodiments, the height h15 and the height h1 may be equal. Also, the protruding portion 5 and the protruding portion 4 may be integrally formed, or they may be separately formed. Note that FIGS. 2 and 3 are views of the interior of the vacuum chamber 1 with the top plate 11 being omitted while leaving the protruding portion 4 in the vacuum chamber 1.

As shown in FIG. 6, which is an enlarged partial view of about half of FIG. 1, a separation gas supply pipe 51 is connected to a center portion of the top plate 11 of the vacuum chamber 1, and such a configuration allows $N_2$ gas to be supplied to a space 52 between the top plate 11 and the core portion 21. By supplying the $N_2$ gas to the space 52, the pressure in the narrow space 50 between the protruding portion 5 and the rotary table 2 can be maintained at a higher pressure than the pressures at the first region 48A and the second region 48B. Thus, the DIPAS gas discharged from the raw material gas nozzle 31 in the first region 48A can be prevented from reaching the second region 48B via the high-pressure space 50. Also, the $O_3$ gas discharged from the reaction gas nozzle 32 in the second region 48B can be prevented from reaching the first region 48A via the high-pressure space 50. In this way, the two gases can be separated by the space 50 and can be substantially prevented from mixing in the gas phase in the vacuum chamber 1. That is, in the film forming apparatus according to the present embodiment, in order to separate the DIPAS gas and the $O_3$ gas, a center region C that is defined by the rotation center portion of the rotary table 2 and the vacuum chamber 1 and is maintained at a higher pressure than the pressures at first region 48A and the second region 48B is provided.

FIG. 7 is a partial cross-sectional view of about half the film forming apparatus 1000 across line B-B of FIG. 3. FIG. 7 shows the protruding portion 4 and the protruding portion 5 integrally formed with the protruding portion 4 at the separation region D1 (D2). As can be appreciated, the protruding portion 4 has a bent portion 46 bent into an L shape at its outer periphery. The bent portion 46 substantially fills the space (gap) between the rotary table 2 and the chamber body 12 and prevents the DIPAS gas from the raw material gas nozzle 31 and the $O_3$ gas from the reaction gas nozzle 32 from passing through this gap and mixing with one another. The gap between the bent portion 46 and the chamber body 12 and the gap between the bent portion 46 and the rotary table 2 may be set up to be substantially equal to the height h1 of the ceiling surface 44 of the protruding portion 4 from the rotary table 2, for example. Also, by providing the bent portion 46, the $N_2$ gas from the separation gas nozzles 41 and 42 (FIG. 3) may be prevented from flowing toward the outer side of the rotary table 2. In this way, the flow of the $N_2$ gas from the separation regions D1 and D2 to the first region 48A and the second region 48B may be promoted. Further, by providing a block member 71b below the bent portion 46, the separation gas ($N_2$ gas) may be prevented from flowing toward a region below the rotary table 2.

Note that the gap between the bent portion 46 and the rotary table 2 is preferably set up to have the above distance (about the height h1 of the ceiling surface 44) in consideration of thermal expansion of the rotary table 2 that may occur when the rotary table 2 is heated by a heater unit as described below.

On the other hand, as shown in FIG. 3, at the first region 48A and the second region 48B, the inner peripheral wall of the chamber body 12 is recessed radially outward, and exhaust regions 6 are formed in the recessed regions. As shown in FIGS. 3 and 6, exhaust ports 61 and 62 may be arranged at the bottom of the exhaust regions 6, for example. The exhaust ports 61 and 62 may be connected to a common vacuum pump 64 (see FIG. 1) corresponding to a vacuum exhaust device via exhaust pipes 63, for example. With such a configuration, gas may be evacuated mainly from the first region 48A and the second region 48B so that the pressures at the first region 48A and the second region 48B may be arranged be lower than the pressures at the separation spaces H of the separation regions D1 and D2 as described above. Note that although the exhaust regions 6 are provided at the regions where the inner peripheral wall of the chamber body 12 are recessed outward in FIG. 3, the exhaust regions do not necessarily have to have such configuration, and various other configurations are possible for providing the exhaust ports 61 and 62 at the bottom of the exhaust regions.

Also, in FIG. 3, the exhaust port 61 for the first region 48A is positioned below the raw material gas nozzle 31 at the outer side (the exhaust region 6) of the rotary table 2. In this way, the DIPAS gas from the raw material gas nozzle 31 can flow along the upper surface of the rotary table 2 toward the exhaust port 61 in the longitudinal direction of the raw material gas nozzle 31.

Referring back to FIG. 1, a pressure regulator 65 is provided in the exhaust pipe 63, and in this way, the pressure in the vacuum chamber 1 can be adjusted. Note that in some embodiments, a plurality of pressure regulators 65 may be provided for the respective exhaust ports 61 and 62. Also, note that the exhaust ports 61 and 62 are not limited to being provided at the bottom portion of the exhaust regions 6 (the bottom portion 14 of the vacuum chamber 1), but may alternatively be provided at peripheral wall portions of the chamber body 12 of the vacuum chamber 1, for example. Further, the exhaust ports 61 and 62 may be provided on portions of the top plate 11 in the exhaust regions 6, for example. However, when the exhaust ports 61 and 62 are provided on the top plate 11, the gas in the vacuum chamber 1 will flow upward, and as a result, particles in the vacuum chamber 1 may be blown up to cause contamination of the wafer W. As such, the exhaust ports 61 and 62 are preferably provided at the bottom portions of the exhaust regions 6 as shown in FIGS. 3 and 6, or at peripheral wall portions of the chamber body 12. Further, by providing the exhaust ports 61 and 62 at the bottom portions of the exhaust regions 6, the exhaust pipe 63, the pressure regulator 65, and the vacuum pump 64 can be installed below the vacuum chamber 1 so that the footprint of the film forming apparatus 1000 can be reduced.

As shown in FIGS. 1 and 6 to 8, an annular heater unit 7 is provided in the space between the rotary table 2 and the bottom portion 14 of the chamber body 12, and in this way, the rotary table 2 can be heated to a predetermined temperature, and if a wafer W is placed on the rotary table 2, the wafer W may also be heated to the predetermined temperature via the rotary table 2. Also, by providing a block member 71a surrounding the heater unit 7 below the rotary table 2 around the outer periphery of the rotary table 2, the space where the heater unit 7 is placed can be separated from a region outside the heater unit 7. Also, a slight gap is formed between the upper surface of the block member 71a and the lower surface of the rotary table 2 in order to prevent gas from entering the inner side of the block member 71a. The region where the heater unit 7 is accommodated is connected to a plurality of purge gas supply pipes 73 for purging this region. The plurality of purge gas supply pipes 73 penetrate through the bottom portion of the chamber body 12 at predetermined angular intervals to be connected to the region where the heater unit 7 is accommodated. Note that a protective plate 7a for protecting the heater unit 7 is provided above the heater unit 7. The protective plate 7a is supported by the block member 71a and a raised portion R (described below). In this way, even when the DIPAS gas or the $O_3$ gas enters the space where the heater unit 7 is provided, the heater unit 7 can be protected from these gases. The protective plate 7a is preferably made of quartz, for example.

As shown in FIG. 6, the bottom portion 14 of the chamber body 12 has a raised portion R arranged at the inner side of the annular heater unit 7. The upper surface of the raised portion R is arranged close to the rotary table 2 and the core portion 21 such that there are only small gaps between the upper surface of the raised portion R and the lower surface of the rotary table 2 and between the upper surface of the raised portion R and the lower surface of the core portion 21. Also, the bottom portion 14 has a center hole through which the rotating shaft 22 passes. The inner diameter of the center hole is slightly larger than the diameter of the rotating shaft 22 to thereby provide a gap that communicates with the interior of the case body 20 via a flange portion 20a. A purge gas supply pipe 72 is connected to the upper portion of the flange portion 20a.

With such a configuration, as shown in FIG. 6, $N_2$ gas from the purge gas supply pipe 72 may flow into the space below the rotary table 2 via the gap between the rotating shaft 22 and the center hole of the bottom portion 14, the gap between the core portion 21 and the raised portion R of the bottom portion 14, and the gap between the raised portion R of the bottom portion 14 and the lower surface of the rotary table 2. Also, $N_2$ gas from the purge gas supply pipes 73 may flow into the space below the heater unit 7. Then, the $N_2$ gas supplied from the purge gas supply pipes 72 and 73 flows into the exhaust port 61 through the gap between the block member 71a and the lower surface of the rotary table 2. The $N_2$ gas flowing in this manner acts as a separation gas for preventing the DIPAS gas (or $O_3$ gas) from circulating in the space below the rotary table 2 and mixing with the $O_3$ gas (or DIPAS gas).

As shown in FIGS. 2, 3 and 8, a transfer port 15 is formed at a peripheral wall portion of the chamber body 12. The wafer W can be transferred into the vacuum chamber 1 by a transfer arm 10 through the transfer port 15 or transferred out of the vacuum chamber 1 through the transfer port 15. A gate valve (not shown) is provided at the transfer port 15, and in this way, the transfer port 15 can be opened and closed. Three through holes (not shown) are formed at the bottom of the recessed portion 24 so that three lift pins 16 (see FIG. 8) can move up and down through these through holes. The lift pins 16 support the rear surface of the wafer W to raise and lower the wafer W, and in this way, the wafer W can be passed to and from the transfer arm 10.

Also, as shown in FIG. 3, the film forming apparatus 1000 according to the present embodiment includes a control unit 200 for controlling the overall operation of film forming apparatus 1000. The control unit 200 includes a process controller 200a configured by a computer, a user interface unit 200b, and a memory device 200c, for example. The user interface unit 200b may include, for example, a display for displaying the operation status of the film forming apparatus and an input device, such as a keyboard or a touch panel, to be operated by an operator of the film forming apparatus to select a process recipe or a process manager to change parameters of the process recipe (not shown).

The control unit 200 also performs control for executing a film formation time setting method, which will be described below.

The memory device 200c stores a control program for causing the process controller 200a to execute various processes, process recipes, parameters for various processes, and the like. Also, the programs stored in the memory device include, for example, a program describing a set of steps for executing a film formation time setting method (described below). These control programs and process recipes are read and executed by the process controller 200a in accordance with an instruction from the user interface unit 200b. Further, these programs may be stored in a computer readable storage medium 200d and installed in the memory device 200c via a corresponding input/output device (not shown). The computer-readable storage medium 200d may be a hard disk, a CD, a CD-R/RW, a DVD-R/RW, a flexible disk, a semiconductor memory, or the like. Further, the program may be downloaded to the memory device 200c via a communication line, for example.

[Film Formation Time Setting Method]

Figure 9:
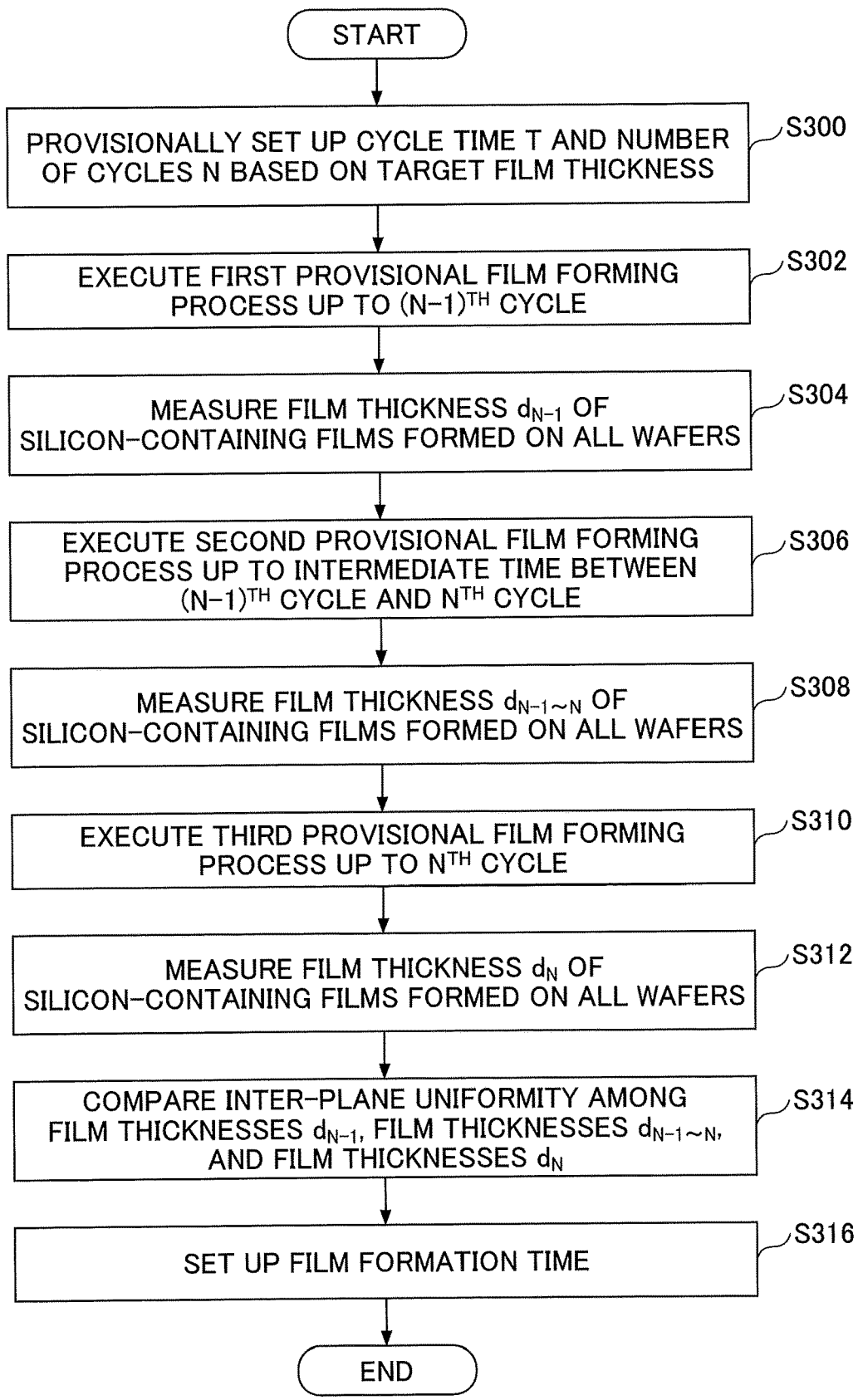
FIG. 9 is a flowchart of a film formation time setting method according to an embodiment of the present invention.
Figure 10:
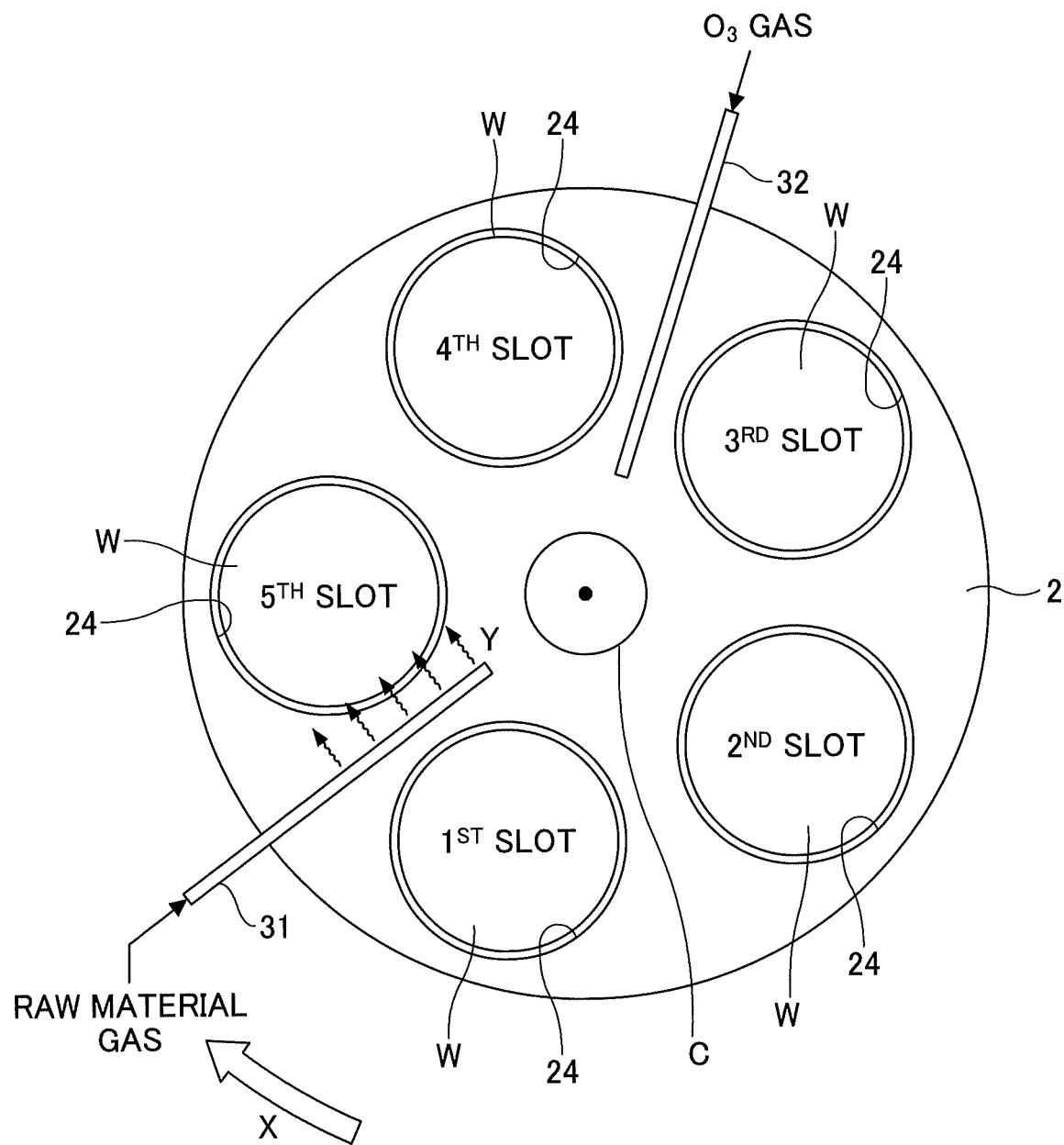
FIG. 10 is a schematic diagram illustrating influences of the flow of a raw material gas at the start of film formation.

In the following, a film formation time setting method according to an embodiment of the present invention will be described with reference to FIGS. 9 to 12. FIG. 9 is a flowchart of a film formation time setting method according to an embodiment of the present invention. FIG. 10 is a schematic diagram illustrating an influence of the flow of the raw material gas at the start of film formation.

The film formation time setting method according to the present embodiment is suitably implemented for setting up the film formation time of a film forming process with a relatively long cycle time (time per rotation of the rotary table 2) of 1 second or more. For example, in the following description of the present embodiment, a case where the rotation speed of the rotatory table 2 is set to 20 rmp will be described. In this case, the cycle time T corresponding to the time per rotation of the rotary table 2 is 3 seconds. That is, in the following description of the film formation time setting method according to the present embodiment, a method of setting up the film formation time when forming a silicon-containing film using the rotary table 2 that rotates at a relatively slow rotation speed will be described.

As shown in FIG. 9, in the film formation time setting method according to the present embodiment, first, the cycle time T and the number of cycles N are provisionally set up based on a preset target film thickness (step S300). In a typical film forming process, the target film thickness may be set to 9 nm, 10 nm, or the like. Also, the cycle time T corresponding to the rotation speed of the rotary table 2 is set up, and the film thickness of the silicon-containing film to be formed on the wafer W per cycle time T is also measured in advance and acquired by an administrator as known information. For example, the acquired information on the film thickness of the silicon-containing film per cycle time T may indicate that a film thickness of 10 angstroms (Å) is formed per cycle time T. Thus, the number of cycles N can be calculated by dividing the target film thickness by the film thickness per cycle time T. Then, the provisional film formation time can be set up by multiplying the cycle time T by the calculated number of cycles N.

Conventionally, the time T×N obtained by the above calculation method is set up as the film formation time, and a film forming process is executed for the duration of the above film formation time. However, in a film forming method that involves rotating the rotary table 2 to execute a film forming process on a plurality of wafers W, when the film forming process is performed for the duration of the film formation time T×N that is set up in the above-described manner, inter-plane uniformity of the silicon-containing films formed on the wafers W may be compromised due to various factors, and there is room for improving inter-plane uniformity of the film thickness and the like of the silicon-containing films formed on the wafers W. Note that indicators of inter-plane uniformity may include film thickness uniformity of the silicon-containing films formed on the wafers W as well as film quality uniformity of the silicon-containing films formed on the wafers W, for example.

In the following, one factor that influences the inter-plane uniformity of the silicon-containing films formed on the wafers W will be described with reference to FIG. 10. FIG. 10 shows the rotary table 2 having five recessed portions 24 arranged at equal intervals along the circumferential direction similar to the rotary table 2 in the processing chamber 100 described above with reference to FIGS. 2 and 3, for example. In FIG. 10, a wafer W is placed in each of the recessed portions 24. Note that in the present embodiment, although not shown in the drawings, a film forming apparatus with a processing chamber similar to the processing chamber 100 shown in FIGS. 2 and 3 but further including a plasma processing region is used to perform a modification process on the silicon-containing films by supplying Ar/$O_2$/$H_2$ gas to the plasma processing region and supplying a radio frequency power to a plasma generator in the plasma processing region to generate plasma from the $Ar/O_2/H_2$ gas. Note, however, that a detailed description of the modification process will be omitted from the present description. Also, in the following description, the five recessed portions 24 will be numbered and referred to as first slot, second slot, third slot, fourth slot, and fifth slot. Also, it is assumed that at the time rotation of the rotary table 2 is started, the material gas nozzle 31 is located between the first slot and the fifth slot, and the rotary table 2 rotates in the clockwise direction (X direction).

When the rotary table 2 starts to rotate in the clockwise direction, DIPAS gas as the raw material gas is first supplied to the first slot, and then to the second slot, the third slot, the fourth slot, and the fifth slot in the above recited order. In other words, the wafer W placed in the fifth slot is the last substrate to be supplied the raw material gas and be subjected to the film forming process.

When the cycle time T of 3 seconds elapses, the material gas nozzle 31 returns to the position between the first slot and the fifth slot. The rotation of the rotary table 2 causes each slot to pass the raw material gas nozzle 31 and then the reaction gas nozzle 32. In the illustrated example, $O_3$ gas is supplied to the DIPAS adsorbed on each of the wafers W, and a silicon-containing film with the film thickness per cycle time T (e.g., film thickness of approximately 10 angstroms) is formed on each of the wafers W.

In principle, an equal amount of raw material gas should be supplied to the five slots. However, in reality, as shown in FIG. 10, when discharge of the raw material gas is started in the raw material gas supply region, the raw material gas may spread out toward the wafer W in the fifth slot at the rotation direction upstream side (Y direction in FIG. 10), and a small amount of the raw material gas may already by adsorbed to the wafer W in the fifth slot before the raw material gas nozzle 31 reaches the fifth slot by the rotation of the rotary table 2. Note that because a high-pressure separation gas is arranged to flow in the center region C as described above, the raw material gas can generally be prevented from flowing into the second through fourth slots.

In order to uniformly supply the raw material gas to each slot, the position of the raw material gas nozzle 31 at the start of rotation of the rotary table 2 is preferably positioned between an adjacent pair of slots. For example, as shown in FIG. 10, the raw material gas nozzle 31 is preferably positioned at an intermediate position between adjacent slots. However, in a film forming method where the raw material gas nozzle 31 is positioned at an intermediate position between two adjacent slots, and rotation of the rotary table 2 is started so that the raw material gas is sequentially supplied to each slot, the raw material gas inevitably flows in the Y direction as shown in FIG. 10 when gas discharge is started.

As such, excess raw material gas resulting from this gas flow may be supplied to the slot at the rotation direction upstream side of the raw material gas nozzle 31. The inventors of the present invention have determined that such a gas flow is one of the factors that adversely influence inter-plane uniformity of the film thickness of the silicon-containing films formed on the wafers W in the slots.

Another factor that adversely influences inter-plane uniformity may include the phenomenon of excess raw material gas remaining in the raw material gas nozzle 31 flowing out and being supplied to one or more slots at the end of the film forming process when the supply of the raw material gas from the raw material gas nozzle 31 is ended, for example. Note that the adverse influence from such a phenomenon may be particularly prominent in a case where the raw material gas nozzle 31 is not an injector type gas nozzle as shown in the drawings but is instead a shower head type gas nozzle having a wide gas supply surface, for example.

The film formation time setting method according to the present embodiment makes it possible to improve inter-plane uniformity of the film thickness and the like of the silicon-containing films formed on the wafers W placed in the slots. In other words, an aspect of the present invention is directed to improving inter-plane uniformity among the silicon-containing films formed in the slots through a method of setting an optimal film formation time rather than taking the approach of improving the performance of the film forming apparatus, improving gas supply control, or improving the rotation control of the rotary table, for example.

Referring back to FIG. 9, after provisionally setting up the cycle time T and the number of cycles N and setting up the calculated time T×N as the provisional film formation time, a provisional film forming process up to the $(N-1)^{th}$ cycle corresponding to the cycle immediately before the last cycle is executed (first provisional film forming process, step S302). In the provisional film forming process, the raw material gas nozzle 31 is positioned between adjacent slots as shown in FIG. 10, and gas discharge from the raw material gas nozzle 31 is started. At the same time, although not shown in FIG. 10, $N_2$ gas is supplied from the separation gas nozzles 41 and 42 (see FIGS. 2 and 3), $O_3$ gas is supplied from the reaction gas nozzle 32, and rotation of the rotary table 2 is started. Note that the initial position of the raw material gas nozzle 31 is not necessarily a determining factor affecting the inter-plane uniformity of the films to be formed, and as such, the raw material gas nozzle 31 does not necessarily have to be initially positioned between adjacent slots as described above in the present embodiment. Then, the rotary table 2 is rotated up to the $(N-1)^{th}$ cycle, and silicon-containing films are formed in the first through fifth slots. Note that atomic layer deposition (ALD) is used as the film forming method to sequentially cause adsorption of silicon-containing gas (raw material gas) to the surfaces of wafers W and oxidation of the silicon-containing gas adsorbed to the surfaces of the wafers W multiple times while continuing rotation of the rotary table 2.

After the $(N-1)^{th}$ cycle of the provisional film forming process is completed, the supply of the above-described gases is stopped and the rotation of the rotary table 2 is stopped. Then, the film thicknesses $d_{N-1}$ of the silicon-containing films formed in the first through fifth slots by the film forming process performed up to the $(N-1)^{th}$ cycle are measured by a film thickness measuring device such as an ellipsometer (step S304).

Then, after the wafers W having the silicon-containing films formed thereon are removed from the rotary table 2 and unloaded from the processing chamber 100, new wafers W having no silicon-containing films formed thereon are loaded into the processing chamber 100 and placed in the recessed portions 24 of the first through fifth slots, and the raw material gas nozzle 31 is positioned at an intermediate position between two adjacent slots as shown in FIG. 10 to execute a second provisional film forming process. In the second provisional film forming process, the time between the $(N-1)^{th}$ cycle and the $N^{th}$ cycle is divided into a plurality of time intervals, and a provisional film forming process is executed up to the $(N-1)^{th}$ cycle plus the divided time interval. In the present embodiment, the cycle time T is 3 seconds, and the time between the $(N-1)^{th}$ cycle to the $N^{th}$ cycle is divided into 1-second time intervals. Thus, a second provisional film forming process up to the $(N-1)^{th}$ cycle plus 1 second and a second provisional film forming process up to the $(N-1)^{th}$ cycle plus 2 seconds (i.e., up to the $N^{th}$ cycle minus 1 second) are executed. That is, the second provisional film forming process is executed twice by varying the film formation time by 1 second.

Specifically, first, after the wafers W having the silicon-containing films formed thereon are removed from the rotary table 2 and unloaded from the processing chamber 100, new wafers W having no silicon-containing films formed thereon are loaded into the processing chamber 100 and placed in the recessed portions 24 of the first through fifth slots, and the raw material gas nozzle 31 is positioned at an intermediate position between two adjacent slots as shown in FIG. 10 to execute a second provisional film forming process with a film formation time up to the $(N-1)^{th}$ cycle plus 1 second (step S306). Then, the film thicknesses $d_{(N-1)+1\ sec}$ of the silicon-containing films formed in the first through fifth slots by the film forming process performed up to the $(N-1)^{th}$ cycle plus 1 second are measured by a film thickness measuring device such as an ellipsometer (step S308).

Then, after the wafers W having the silicon-containing films formed thereon are removed from the rotary table 2 and unloaded from the processing chamber 100, new wafers W having no silicon-containing films formed thereon are loaded into the processing chamber 100 and placed in the recessed portions 24 of the first through fifth slots, and the raw material gas nozzle 31 is positioned at an intermediate position between two adjacent slots as shown in FIG. 10 to execute a second provisional film forming process for the second time with a film formation time up to the $(N-1)^{th}$ cycle plus 2 seconds (step S306). Then, the film thicknesses $d_{(N-1)+2\ sec}$ of the silicon-containing films formed in the first through fifth slots by the film forming process performed up to the $(N-1)^{th}$ cycle plus 2 seconds are measured by a film thickness measuring device such as an ellipsometer (step S308).

Then, after the wafers W having the silicon-containing films formed thereon are removed from the rotary table 2 and unloaded from the processing chamber 100, new wafers W having no silicon-containing films formed thereon are loaded into the processing chamber 100 and placed in the recessed portions 24 of the first through fifth slots, and the raw material gas nozzle 31 is positioned at an intermediate position between two adjacent slots as shown in FIG. 10 to execute a third provisional film forming process up to the $N^{th}$ cycle, which has initially been set up as the provisional film formation time (step S310). Then, the film thicknesses $d_N$ of the silicon-containing films formed in the first through fifth slots by the film forming process performed up to the $N^{th}$ cycle are measured by a film thickness measuring device such as an ellipsometer (step S312).

Note that the above process steps S300 to S312 correspond to a film thickness measuring step of the film formation time setting method according to the present embodiment.

Then, the inter-plane uniformity of the group of film thicknesses $d_{(N-1)}$ measured in step S304 corresponding to the film thicknesses of the silicon-containing films formed in the first through fifth slots by the film forming process performed up to the $(N-1)^{th}$ cycle, the inter-plane uniformity of the group of film thicknesses $d_{(N-1)-N}$ measured in step S308 corresponding to the film thicknesses of the silicon-containing films formed in the first through fifth slots by the film forming processes performed up to intermediate times between the $(N-1)^{th}$ cycle and the $N^{th}$ cycle, and the inter-plane uniformity of the group of film thicknesses $d_N$ measured in step S312 corresponding to the film thicknesses of the silicon-containing films formed in the first through fifth slots by the film forming process performed up to the $N^{th}$ cycle are compared (step S314).

Upon comparing the inter-plane uniformities of the film thicknesses of the films formed at the respective times, if it is determined that the group of film thicknesses $d_N$ of the films formed in the first through fifth slots at the end time of the $N^{th}$ cycle has better inter-plane uniformity as compared with the inter-plane uniformities of the film thicknesses of the films formed at the other times (e.g., if the film thicknesses $d_N$ are closest to each other), the end time of the $N^{th}$ cycle that has been provisionally set up as the provisional film formation time is formally set up as the film formation time (step S316).

On the other hand, upon comparing the inter-plane uniformities of the film thicknesses, if it is determined that the group of film thicknesses $d_{(N-1)}$ of the films formed in the first through fifth slots at the end time of the $(N-1)^{th}$ cycle has better inter-plane uniformity as compared with the inter-plane uniformities of the film thicknesses of the films formed at the other times, the film formation time that has been provisionally set to the end time of the $N^{th}$ cycle is corrected, and the end time of the $(N-1)^{th}$ cycle is formally set up as the film formation time (step S316).

Note that the above process steps S314 and S316 correspond to a film formation time specifying step of the film formation time setting method according to the present embodiment.

However, in practice, due to the influence of the flow of the raw material gas at the start of gas discharge as described above, a film formation time for achieving optimal inter-plane uniformity is more likely to be an intermediate time between the provisionally set $N^{th}$ cycle and the immediately preceding $(N-1)^{th}$ cycle (e.g. the $(N-1)^{th}$ cycle plus 1 second or the $(N-1)^{th}$ cycle plus 2 seconds in the above example). In this respect, a method for specifying a film formation time between the $N^{th}$ cycle and the $(N-1)^{th}$ cycle and setting up the corresponding time as the film formation time (film formation time specifying step) will be described below with reference to FIGS. 11 and 12.

Figure 11:
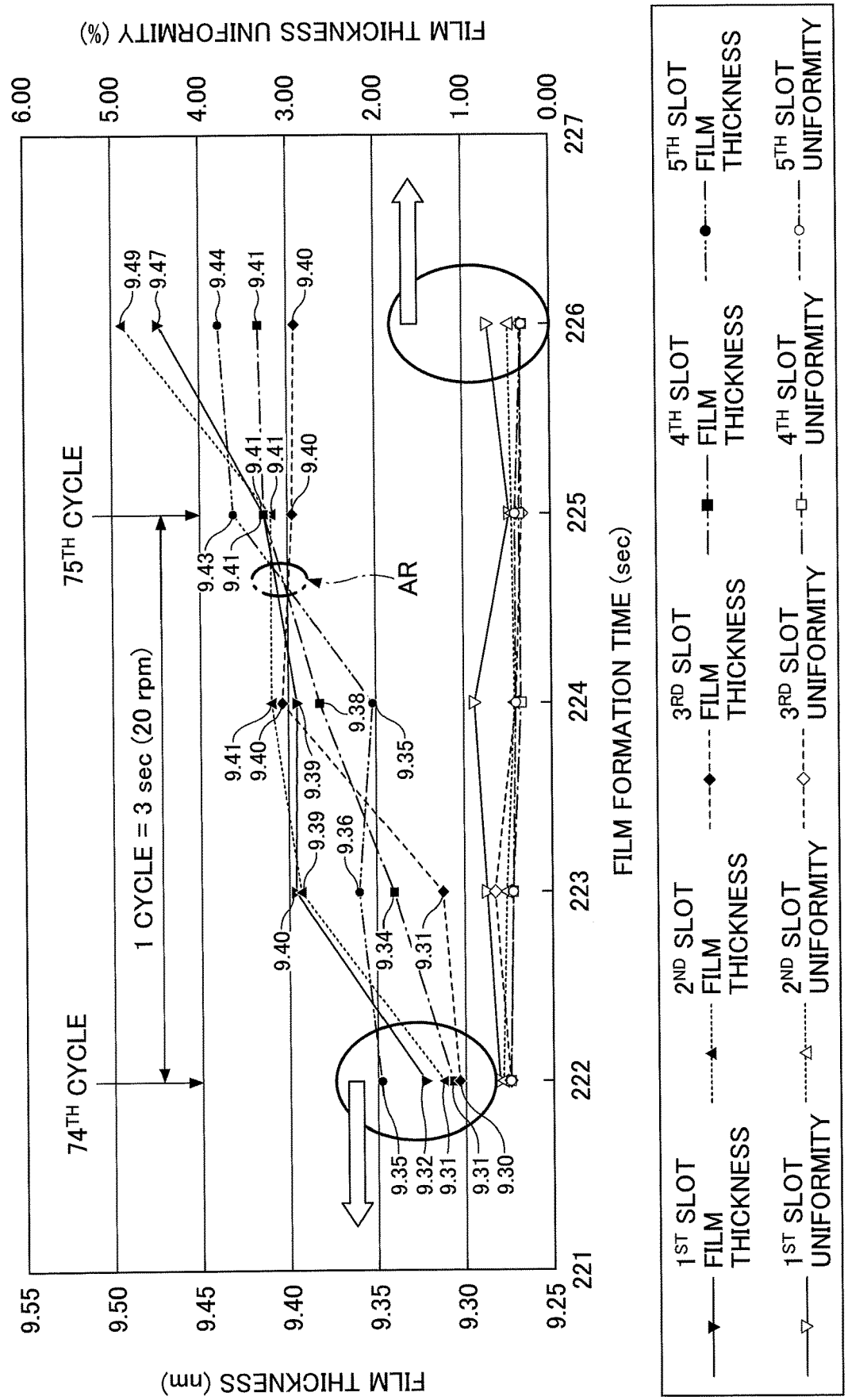
FIG. 11 is a diagram indicating example results of implementing a film formation time setting method according to an embodiment of the present invention.

FIG. 11 is a diagram indicating example results of implementing the film formation time setting method according to the present embodiment. Specifically, FIG. 11 indicates film thickness measurements of the silicon-containing films formed in the first through fifth slots at film formation times up to the $(N-1)^{th}$ cycle ($74^{th}$ cycle in the present example) through the $N^{th}$ cycle ($75^{th}$ cycle in the present example) in the provisional film forming processes and corresponding film thickness uniformity calculation results. Note that in the example of FIG. 11, the film thickness measurement is performed up to the $N^{th}$ cycle plus 1 second (226 seconds) in view of the fact that the raw material gas remaining in the material gas nozzle 31 after the end of the $N^{th}$ cycle may still be discharged and cause oxidization. However, in terms of specifying the film formation time, the temporal change in the film thicknesses from 222 seconds ($74^{th}$ cycle) to 225 seconds ($75^{th}$ cycle) in FIG. 11 will be of interest. Also, note that the film thickness uniformity is represented as a percentage difference of a given film thickness from an average film thickness calculated by obtaining the difference between the average value of the film thicknesses of the silicon-containing films formed in the first through fifth slots at a given film formation time and the film thickness of the silicon-containing film formed in a given slot at the given film formation time, dividing the difference by the average value, and multiplying the resulting value by 100.

As shown in FIG. 11, the film thickness measurement of the silicon-containing film formed in each slot at each film formation time is plotted on a graph having a time axis (horizontal axis) and a film thickness axis (vertical axis), and the film thicknesses at the various film formation times plotted for each slot are connected to form a line graph. Note that instead of connecting the plotted film thicknesses into a straight line as shown in FIG. 11, the plotted film thicknesses may be connected to form a curved line, or an approximate curve passing each plotted film thickness may be obtained and graphed, for example.

As shown in FIG. 10, in the provisional film forming process according to the present embodiment, the raw material gas nozzle 31 is positioned at an intermediate position between the first slot and the fifth slot, and the rotary table 2 is rotated to supply the raw material gas to the first through fifth slots. As can be appreciated from the temporal change in the film thickness measurement in the first slot in FIG. 11, at 222 seconds corresponding to the time up to the $(N-1)^{th}$ cycle ($74^{th}$ cycle), the film thickness measurement is 9.32 nm, and as the raw material gas is supplied over the next second up to 223 seconds, the film thickness measurement increases from 9.32 nm to 9.40 nm. Note that because the raw material gas is not supplied to the first slot at 224 seconds and at 225 seconds corresponding to the $N^{th}$ cycle ($75^{th}$ cycle), there is hardly any change in the film thickness measurement in the first slot, and at the $N^{th}$ cycle ($75^{th}$ cycle), the film thickness measurement in the first slot is 9.41 nm.

In the second slot, the raw material gas is similarly supplied from 222 seconds corresponding to the time up to the $(N-1)^{th}$ cycle ($74^{th}$ cycle) to 223 seconds, and as such, the temporal change in the film thickness measurement in the second slot is similar to that in the first slot. The amount of change in the film thickness measurement in the second slot is also similar to that in the first slot. Specifically, in the second slot, the film thickness measurement at 222 seconds is 9.31 nm, and the film thickness measurement at 225 seconds is 9.41 nm.

In the third slot, the raw material gas is supplied during the time between 223 seconds and 224 seconds, and as such, the film thickness measurement in the third slot at 222 seconds and at 223 seconds is substantially the same (9.30 nm and 9.31 nm, respectively), and at 224 seconds, the film thickness measurement increases to 9.40 nm. Further, there is no substantial change in the film thickness measurement in the third slot from 224 seconds to 225 seconds.

The temporal change in the film thickness measurement in the fourth slot is slightly different from the other slots. Specifically, the raw material gas is supplied to the fourth slot during the time between 223 seconds and 224 seconds such that the film thickness measurement changes from 9.34 nm to 9.38 nm. The film thickness measurement in the fourth slot also increases from 224 seconds to 225 seconds such that the film thickness measurement ultimately reaches 9.41 nm like the other slots.

As described above, the film thicknesses of the silicon-containing films formed in the above-described four slots including the first through fourth slots are substantially the same at 222 seconds corresponding to the time up to the $(N-1)^{th}$ cycle (i.e., 9.30 nm to 9.32 nm), and the film thicknesses of the silicon-containing films are also substantially the same at 225 seconds corresponding to the time up to the $N^{th}$ cycle (i.e., 9.40 nm to 9.41 nm).

On the other hand, with respect to the temporal change in the film thickness measurement of the silicon-containing film formed in the fifth slot, at 222 seconds corresponding to the time up to the $(N-1)^{th}$ cycle, the film thickness measurement of the silicon-containing film is 9.35 nm, which is about 0.04 nm greater than the film thickness measurements of the silicon-containing films formed in the other slots at 222 seconds. Also, the film thickness measurement of the silicon-containing film formed in the fifth slot at 225 seconds corresponding to the time up to the $N^{th}$ cycle is 9.43 nm, which is about 0.03 nm greater than the film thickness measurements of the silicon-containing films formed in the other slots at 225 seconds.

Note that the raw material gas flowing into the fifth slot at the time gas discharge of the raw material gas is started as described above may be one factor explaining why the film thickness of the silicon-containing film formed in the fifth slot is slightly greater than the film thicknesses of the silicon-containing films formed in the other slots. In view of such a phenomenon, if the film formation time is set to the initially (provisionally) set time of 225 seconds (time up to the $75^{th}$ cycle), there will be a variation between the film thickness of the silicon-containing film formed in the fifth slot and the film thicknesses of the silicon-containing films formed in the other slots. Thus, there is room for improving inter-plane uniformity of the film thicknesses of the silicon-containing films formed in the slots.

Figure 12:
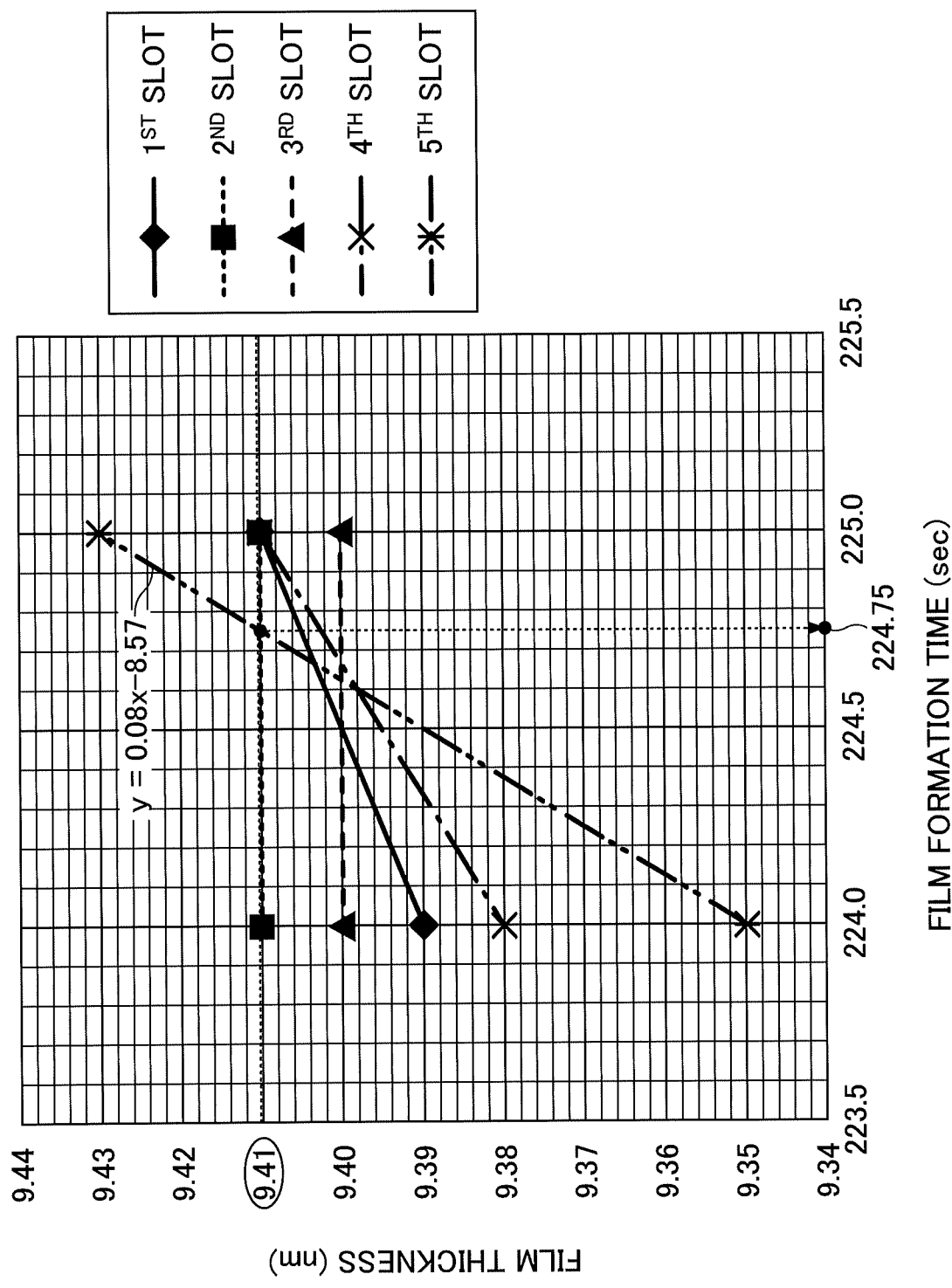
FIG. 12 is a diagram extracting a portion of the results shown in FIG. 11.

In FIG. 11, it can be appreciated that the line graphs representing the temporal changes in the film thicknesses of the silicon-containing films formed in the five slots intersect at an area AR, which is temporally located between the provisional film formation time up to the $N^{th}$ cycle (225 seconds) and 1 second before the $N^{th}$ cycle (224 seconds). FIG. 12 is an enlarged view of the line graphs representing the temporal changes in the film thicknesses between 224 seconds and 225 seconds extracted from FIG. 11.

With respect to the first through fourth slots, there is very little difference in the film thicknesses of the silicon-containing films formed at 225 seconds, and the difference in the film thicknesses of the silicon-containing films formed at 224 seconds is also very small. As such, in the following, it is assumed that the film thicknesses of the silicon-containing films formed in the first through fourth slots (slots other than the fifth slot) between 224 seconds and 225 seconds are the same film thickness and that there is no change in the film thickness from 224 seconds to 225 seconds. Specifically, the film thickness of the silicon-containing films in the first through fourth slots between 224 seconds and 225 seconds is set to an unambiguous film thickness $d_{NFIX}$=9.41 nm. In the illustrated example, the film thickness $d_N$ of the silicon-containing films in the first through fourth slots between 224 seconds and 225 seconds is unambiguously set to film thickness $d_{NFIX}$=9.41 nm, and a line graph y=9.4 that is parallel to the time axis is plotted (dotted line graph in FIG. 12).

With respect to the fifth slot, a film thickness plotted at 224 seconds and a film thickness plotted at 225 seconds are connected by a straight line, and a linear function graph varying as a function of time is created. In the illustrated example, a linear function graph of y=0.08x-8.57 is plotted in FIG. 12.

Then, the intersection point of the above two graphs y=9.41 and y=0.08x-8.57 is obtained, and the film formation time at the obtained intersection point is determined to be 224.75 seconds. In the film formation time setting method according to the present embodiment, the above-determined film formation time of 224.75 seconds is specified as the film formation time for achieving optimal inter-plane uniformity, and 224.75 seconds is set up as the film formation time. That is, the film formation time is specified as a time corresponding to the initially set provisional film formation time of 225 seconds (cycle time T=3 seconds×number of cycles N=75) minus 0.25 seconds, or a time corresponding to the film formation time at 74 cycles 222 seconds) plus 2.75 seconds.

Table 1 shown below indicates inter-plane uniformity calculation results obtained with respect to the film thicknesses of the silicon-containing films formed in the first through fifth slots at the time up to the $(N-1)^{th}$ cycle 222 seconds) and inter-plane uniformity calculation results obtained with respect to the film thicknesses of the silicon-containing films formed in the first through fifth slots at 224.75 seconds that has been specified by the above-described method.

TABLE 1

|  | 1S | 2S | 3S | 4S | 5S | Average | Inter-Plane Uniformity (±%) |
|---|---|---|---|---|---|---|---|
| $74^{th}$ Cycle (222 sec) | 9.32 | 9.31 | 9.30 | 9.31 | 9.35 | 9.318 | 0.27 |
| $74^{th}$ Cycle + 2.75 sec (224.75 sec) | 9.41 | 9.41 | 9.40 | 9.41 | 9.41 | 9.408 | 0.05 |

Note that in the above Table 1, 1S through 5S respectively represent the first through fifth slots.

As can be appreciated from Table 1, when the film formation time is 224.75 seconds, the film thickness of the silicon-containing film in the fifth slot and the film thickness of the silicon-containing films in the other slots are substantially the same and good inter-plane uniformity can be obtained.

As described above, in a film forming method that involves sequentially forming silicon-containing films on a plurality of wafers W accommodated in a plurality of slots by rotating a rotary table 2, a provisional number of cycles N and a provisional film formation time are set up based on a target film thickness and the rotation speed of the rotary table 2 (cycle time T). Then, the film thicknesses of the silicon-containing films formed in the slots at the $(N-1)^{th}$ cycle are measured, and the film thicknesses of the silicon-containing films formed in the slots at the $N^{th}$ cycle are measured. Further, the time between the $(N-1)^{th}$ cycle and the $N^{th}$ cycle is divided, and the film thicknesses of the silicon-containing films formed in the slots at each time division are measured. Based on these film thickness measurements, a time between the (N-1) th cycle and the $N^{th}$ cycle corresponding to a film formation time for achieving optimal inter-plane uniformity is specified and the specified time is set up as the film formation time. In this way, good inter-plane uniformity can be achieved with respect to the film thickness of the silicon-containing films formed on the wafers W.

Although a film formation time setting method according to the present invention has been described above with respect to illustrative embodiments, the present invention is not limited to these embodiments and various modifications may be made by changing or combining other features with the above embodiments without departing from the scope of the present invention.

What is claimed is:

1. A film formation time setting method to be implemented when forming silicon-containing films on a plurality of substrates by arranging the substrates along a circumferential direction on a rotary table accommodated in a processing chamber, rotating the rotary table, and performing a film forming process for a predetermined film formation time, the film formation time setting method comprising:

a film thickness measuring step that includes performing a provisional film forming process for a provisional film formation time T×N, which is provisionally set up based on a cycle time T and a number of cycles N, measuring a film thickness $d_{N-1}$ of each of the silicon-containing films formed on the substrates at an end time of a $(N-1)^{th}$ cycle of the provisional film formation process, measuring a film thickness $d_{N-1 \sim N}$ of each of the silicon-containing films formed on the substrates at an intermediate time between the $(N-1)^{th}$ cycle and a $N^{th}$ cycle of the provisional film forming process, and further measuring a film thickness $d_N$ of each of the silicon-containing films formed on the substrates at an end time of the $N^{th}$ cycle of the provisional film forming process; and a film formation time specifying step that includes comparing an inter-plane uniformity of the silicon-containing films formed on the substrates at the end time of the $(N-1)^{th}$ cycle, an inter-plane uniformity of the silicon-containing films formed on the substrates at the intermediate time between the $(N-1)^{th}$ cycle and the $N^{th}$ cycle, an inter-plane uniformity of the silicon-containing films formed on the substrates at the end time of the $N^{th}$ cycle to specify a time at which an optimal inter-plane uniformity of the silicon-containing films is achieved, and setting up the specified time as a film formation time.

2. The film formation time setting method according to claim 1, wherein
the optimal inter-plane uniformity is characterized at least by achieving a smallest film thickness difference among the silicon-containing films formed on the substrates.

3. The film formation time setting method according to claim 1, wherein
the film thickness measuring step includes setting up a plurality of intermediate times between the $(N-1)^{th}$ cycle and the $N^{th}$ cycle, and measuring the film thickness $d_{N-1 \sim N}$ of each of the silicon-containing films formed on the substrates at the plurality of intermediate times; and
the film formation time specifying step includes comparing at least four inter-plane uniformities associated with at least four different times including the end time of the $(N-1)^{th}$ cycle, the end time of the $N^{th}$ cycle, and at least two intermediate times between the $(N-1)^{th}$ cycle and the $N^{th}$ cycle.

4. The film formation time setting method according to claim 3, wherein the intermediate times are set up at intervals of 1 second.

5. The film formation time setting method according to claim 1, wherein
the film thickness measuring step includes performing an individual provisional film forming process with respect to each film thickness measurement time;
a first provisional film forming process is performed for a film formation time T×(N-1) when measuring the film thickness $d_{N-1}$ at the end time of the $(N-1)^{th}$ cycle;
a second provisional film forming process is separately performed for a film formation time T×(N-1~N) when measuring the film thicknesses $d_{N-1 \sim N}$ at the intermediate time between the $(N-1)^{th}$ cycle and the $N^{th}$ cycle; and a third provisional film forming process is separately performed for the provisional film formation time T×N when measuring the film thickness $d_N$ at the end time of the $N^{th}$ cycle.

6. The film formation time setting method according to claim 1, wherein
the film formation time specifying step includes creating a graph connecting the film thickness $d_{N-1}$, the film thickness $d_{N-1 \sim N}$, and the film thickness $d_N$ for each of the silicon-containing films formed on the substrates arranged on the rotary table, and using the graph to specify the film formation time.

7. The film formation time setting method according to claim 1, wherein
the film formation time specifying step includes setting up an unambiguous film thickness $d_{NFIX}$ as the film thicknesses $d_N$ of the silicon-containing films formed on the plurality of substrates other than a last substrate that is subjected to the provisional film forming process from among the plurality of substrates arranged on the rotary table, creating a graph connecting the film thickness $d_N$ and the film thickness $d_{N-1 \sim N}$ of the silicon-containing film formed in the last substrate, and obtaining an intersection point between the graph and the unambiguous film thickness $d_{NFIX}$ to specify the film formation time.

* * * * *